(12) United States Patent
Ikeda

(10) Patent No.: US 12,431,477 B2
(45) Date of Patent: Sep. 30, 2025

(54) DISPLAY DEVICE AND METHOD FOR MANUFACTURING THE SAME

(71) Applicant: Japan Display Inc., Tokyo (JP)

(72) Inventor: Masanobu Ikeda, Tokyo (JP)

(73) Assignee: Japan Display Inc., Tokyo (JP)

( * ) Notice: Subject to any disclaimer, the term of this patent is extended or adjusted under 35 U.S.C. 154(b) by 490 days.

(21) Appl. No.: 17/830,709

(22) Filed: Jun. 2, 2022

(65) Prior Publication Data

US 2022/0399319 A1    Dec. 15, 2022

(30) Foreign Application Priority Data

Jun. 9, 2021    (JP) .................................. 2021-096852

(51) Int. Cl.
*H01L 25/16* (2023.01)
*H01L 23/00* (2006.01)
(Continued)

(52) U.S. Cl.
CPC ............ *H01L 25/167* (2013.01); *H01L 24/13* (2013.01); *H01L 24/14* (2013.01); *H10H 20/857* (2025.01);
(Continued)

(58) Field of Classification Search
CPC .... H10H 20/83; H10H 83/832; H10H 20/831; H10H 20/857; H10H 20/0364; H10H 29/832; H10H 29/8321; H01L 2224/81; H01L 2224/16145; H01L 2224/13584; H01L 2224/1403; H01L 2224/16225;
(Continued)

(56) References Cited

U.S. PATENT DOCUMENTS

2011/0254035 A1* 10/2011 Kim .................... H10H 20/8312
257/E33.001
2017/0213803 A1* 7/2017 Bower .................... H01L 24/95
(Continued)

FOREIGN PATENT DOCUMENTS

JP    2007329374 A    12/2007
JP    2020106832 A    7/2020
(Continued)

OTHER PUBLICATIONS

Notice of Reason for Refusal from corresponding Japanese Patent Application No. 2021-096852, mailed Dec. 10, 2024. 12 pages.

*Primary Examiner* — Alia Sabur
(74) *Attorney, Agent, or Firm* — K&L Gates LLP

(57) ABSTRACT

A display device includes an array substrate, a plurality of mounting electrodes provided to the array substrate, a columnar conductor for coupling provided to each of the mounting electrodes, a plurality of light-emitting elements provided to the array substrate, a first electrode and a second electrode provided to a surface of each of the light-emitting elements facing the array substrate, the first electrode being coupled to one of an anode and a cathode of the light-emitting element, the second electrode being coupled to the other of the anode and the cathode of the light-emitting element, and a coupling member covering each of the first electrode and the second electrode. The columnar conductor is made of material harder than the coupling member, and an end of the columnar conductor on the light-emitting element side is electrically coupled to the coupling member.

7 Claims, 13 Drawing Sheets

(51) Int. Cl.
*H10H 20/82* (2025.01)
*H10H 20/831* (2025.01)
*H10H 20/857* (2025.01)

(52) U.S. Cl.
CPC .............. *H01L 24/05* (2013.01); *H01L 24/06* (2013.01); *H01L 24/16* (2013.01); *H01L 24/32* (2013.01); *H01L 24/73* (2013.01); *H01L 2224/05013* (2013.01); *H01L 2224/05027* (2013.01); *H01L 2224/05073* (2013.01); *H01L 2224/05562* (2013.01); *H01L 2224/05568* (2013.01); *H01L 2224/05609* (2013.01); *H01L 2224/05611* (2013.01); *H01L 2224/0615* (2013.01); *H01L 2224/13007* (2013.01); *H01L 2224/13016* (2013.01); *H01L 2224/13022* (2013.01); *H01L 2224/13184* (2013.01); *H01L 2224/1403* (2013.01); *H01L 2224/16145* (2013.01); *H01L 2224/32145* (2013.01); *H01L 2224/73204* (2013.01); *H10H 20/82* (2025.01); *H10H 20/8312* (2025.01)

(58) Field of Classification Search
CPC ... H01L 2224/05568; H01L 2224/1308; H01L 2224/1358; H01L 2924/12041; H01L 2924/00; H01L 24/13; H01L 24/14
See application file for complete search history.

(56) References Cited

U.S. PATENT DOCUMENTS

| | | |
|---|---|---|
| 2018/0090394 A1 | 3/2018 | Bower et al. |
| 2018/0226287 A1 | 8/2018 | Bower et al. |
| 2019/0319015 A1* | 10/2019 | Schuele .............. H01L 25/0753 |
| 2020/0212117 A1* | 7/2020 | Jeon ........................ H10K 71/00 |
| 2020/0235077 A1 | 7/2020 | Jeon et al. |
| 2020/0365771 A1* | 11/2020 | Hiroki .................. H10H 20/835 |
| 2022/0102326 A1 | 3/2022 | Asada |
| 2022/0262782 A1 | 8/2022 | Akimoto |
| 2024/0304611 A1 | 9/2024 | Yamazaki et al. |

FOREIGN PATENT DOCUMENTS

| | | |
|---|---|---|
| JP | 2021-004988 A | 1/2021 |
| WO | 2020049392 A1 | 3/2020 |
| WO | 2021095603 A1 | 5/2021 |

* cited by examiner

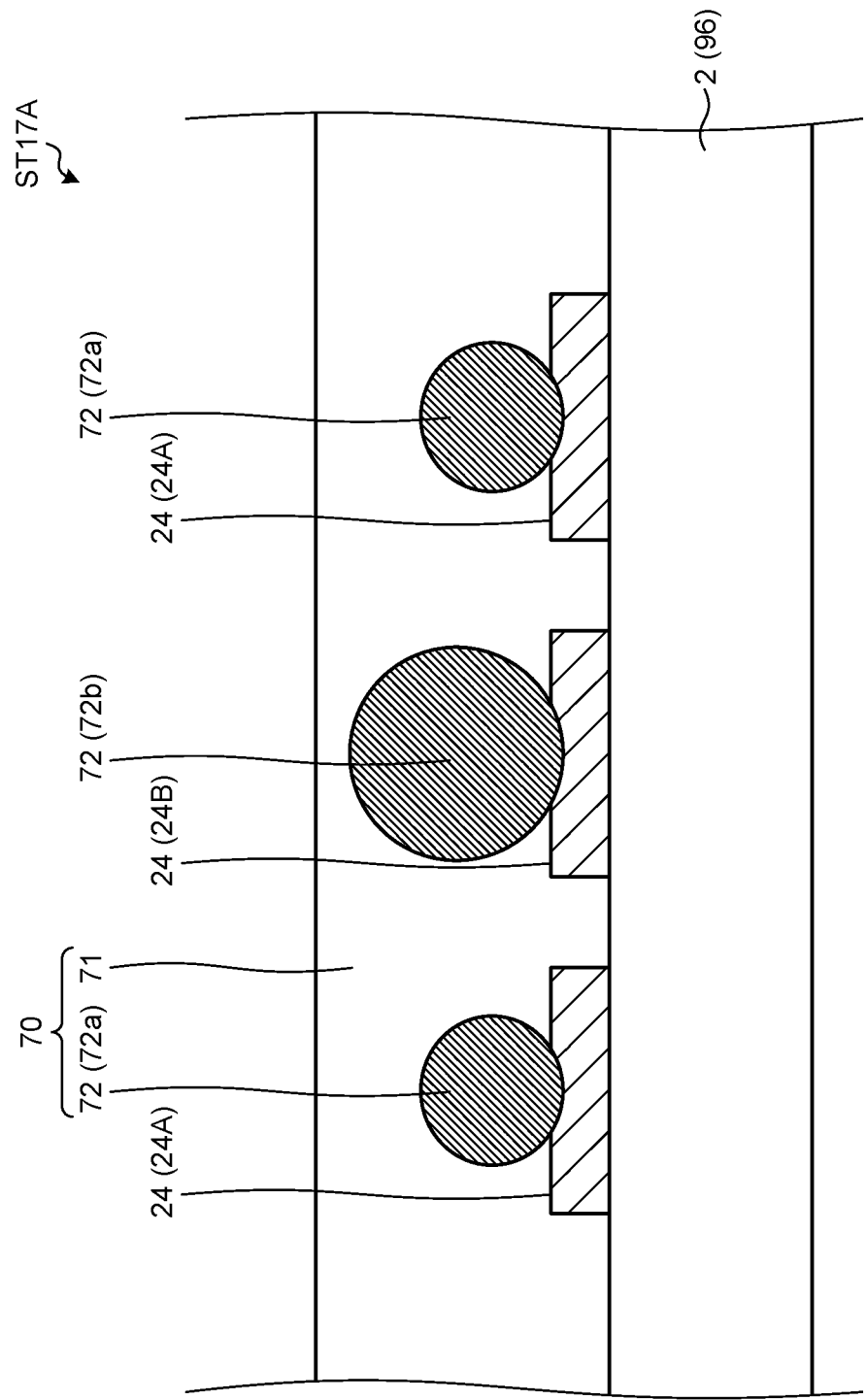

DISPLAY DEVICE AND METHOD FOR MANUFACTURING THE SAME

CROSS-REFERENCE TO RELATED APPLICATION

This application claims the benefit of priority from Japanese Patent Application No. 2021-096852 filed on Jun. 9, 2021, the entire contents of which are incorporated herein by reference.

BACKGROUND

1. Technical Field

The present disclosure relates to a display device and a method for manufacturing the display device.

2. Description of the Related Art

Display devices including micro-sized light-emitting diodes (micro LEDs) serving as display elements have recently been attracting attention (refer to US Patent Publication Nos. 2018-0090394, 2018-0226287, and 2017-0213803 for example). In 2018-090394, 2018-226287, and 2017-213803, conductive coupling posts formed in the light-emitting diodes are coupled to electrodes on an array substrate, whereby the light-emitting diodes are mounted on the array substrate. Another coupling method is described in Japanese Patent Application Laid-open Publication No. 2021-004988 in which light-emitting diodes are coupled to an array substrate with an anisotropic conductive film containing conductive particles interposed therebetween. Some methods for mounting light-emitting diodes are known, including a method of picking up the light-emitting diodes formed on a sapphire substrate or the like onto a carrier substrate and transferring them from the carrier substrate to an array substrate.

In manufacturing such display devices, forming the conductive coupling posts in the light-emitting diodes may possibly complicate the process of transferring the light-emitting diodes to the array substrate. By contrast, using the anisotropic conductive film may possibly make it difficult to secure the coupling stability if anode electrodes and cathode electrodes of the light-emitting diode are formed at different height positions.

An object of the present disclosure is to provide a display device that can secure coupling stability between light-emitting elements and an array substrate and a method for manufacturing the display device.

SUMMARY

A display device according to an embodiment of the present disclosure includes an array substrate, a plurality of mounting electrodes provided to the array substrate, a columnar conductor for coupling provided to each of the mounting electrodes, a plurality of light-emitting elements provided to the array substrate, a first electrode and a second electrode provided to a surface of each of the light-emitting elements facing the array substrate, the first electrode being coupled to one of an anode and a cathode of the light-emitting element, the second electrode being coupled to the other of the anode and the cathode of the light-emitting element, and a coupling member covering each of the first electrode and the second electrode. The columnar conductor is made of material harder than the coupling member, and an end of the columnar conductor on the light-emitting element side is electrically coupled to the coupling member.

A method for manufacturing a display device according to an embodiment is disclosed. The method includes forming a first electrode and a second electrode having different polarities on one surface of a light-emitting element and forming a coupling member covering each of the first electrode and the second electrode, forming a plurality of mounting electrodes on an array substrate and forming a columnar conductor for coupling on each of the mounting electrodes, and applying pressure to the light-emitting element and electrically coupling the columnar conductor and the coupling member.

A display device according to an embodiment of the present disclosure includes an array substrate, a plurality of mounting electrodes provided to the array substrate, a plurality of light-emitting elements provided to the array substrate, a first electrode and a second electrode provided to a surface of each of the light-emitting elements facing the array substrate, the first electrode being coupled to one of an anode and a cathode of the light-emitting element, the second electrode being coupled to the other of the anode and the cathode of the light-emitting element, a coupling member covering each of the first electrode and the second electrode, a conductive particle for coupling provided to each of the mounting electrodes, and a sealing member made of insulating material and provided around the conductive particle between the array substrate and the light-emitting elements. The conductive particle is made of material harder than the coupling member, and the particle size of a first conductive particle overlapping the first electrode is smaller than the particle size of a second conductive particle overlapping the second electrode.

BRIEF DESCRIPTION OF THE DRAWINGS

FIG. 14 is a view for explaining a process of forming an anisotropic conductive film in the method for manufacturing the display device according to the second embodiment.

DETAILED DESCRIPTION

Figure 1:
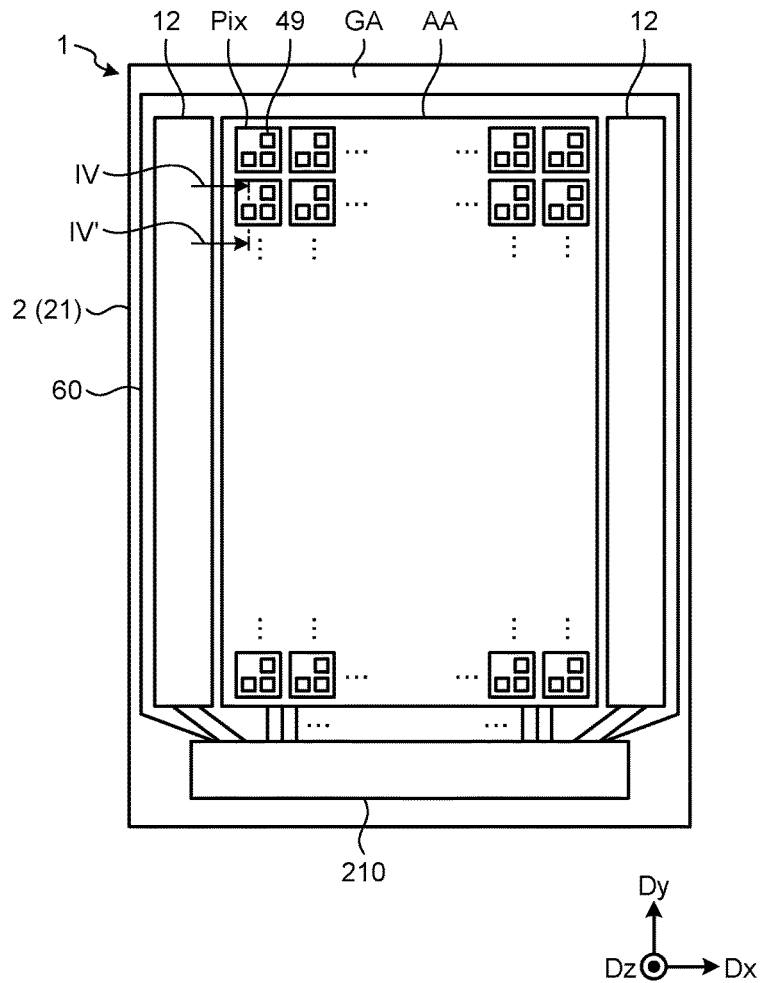
FIG. 1 is a plan view schematically illustrating a display device according to a first embodiment.

Exemplary aspects (embodiments) to embody the present disclosure are described below in greater detail with reference to the accompanying drawings. The contents described in the embodiments below are not intended to limit the present disclosure. Components described below include components easily conceivable by those skilled in the art and components substantially identical therewith. Furthermore, the components described below may be appropriately combined. What is disclosed herein is given by way of example only, and appropriate modifications made without departing from the spirit of the present disclosure and easily conceivable by those skilled in the art naturally fall within the scope of the present disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the drawings, components similar to those previously described with reference to previous drawings are denoted by like reference numerals, and detailed explanation thereof may be appropriately omitted.

To describe an aspect where a first structure is disposed on a second structure in the present specification and the claims, the term "on" includes both of the following cases unless otherwise noted: a case where the first structure is disposed directly on the second structure in contact with the second structure, and a case where the first structure is disposed on the second structure with another structure interposed therebetween.

First Embodiment

FIG. 1 is a plan view schematically illustrating a display device according to a first embodiment. As illustrated in FIG. 1, a display device 1 includes an array substrate 2, pixels Pix, drive circuits 12, a drive integrated circuit (IC) 210, and cathode wiring 60. The array substrate 2 is a drive circuit substrate that drives the pixels Pix and is also called a backplane or an active matrix substrate. The array substrate 2 includes a substrate 21, a plurality of transistors, a plurality of capacitances, various kinds of wiring, and other components.

As illustrated in FIG. 1, the display device 1 has a display region AA and a peripheral region GA. The display region AA is disposed overlapping the pixels Pix and displays an image. The peripheral region GA does not overlap the pixels Pix and is positioned outside the display region AA.

The pixels Pix are arrayed in a first direction Dx and a second direction Dy in the display region AA of the substrate 21. The first direction Dx and the second direction Dy are parallel to the surface of the substrate 21. The first direction Dx is orthogonal to the second direction Dy. The first direction Dx may intersect the second direction Dy without being orthogonal thereto. A third direction Dz is orthogonal to the first direction Dx and the second direction Dy. The third direction Dz corresponds to the normal direction of the substrate 21, for example. In the following description, planar view indicates the positional relation viewed from the third direction Dz.

The drive circuits 12 drive a plurality of gate lines (e.g., a reset control signal line L5, an output control signal line L6, a pixel control signal line L7, and an initialization control signal line L8 (refer to FIG. 3)) based on various control signals supplied via wiring extending from the drive IC 210. The drive circuits 12 sequentially or simultaneously select a plurality of gate lines and supply gate drive signals to the selected gate lines. As a result, the drive circuits 12 select the pixels Pix coupled to the gate lines.

The drive IC 210 is a circuit that controls display on the display device 1. A plurality of wires extend from the drive IC 210 toward the pixels Pix (e.g., a video signal line L2, a reset power supply line L3, and an initialization power supply line L4 (refer to FIG. 3)). The drive IC 210 is mounted on the peripheral region GA of the substrate 21 as chip on glass (COG). The mounting form of the drive IC 210 is not limited thereto, and the drive IC 210 may be mounted on a flexible printed circuit board or a rigid circuit board coupled to the peripheral region GA of the substrate 21.

The cathode wiring 60 is provided in the peripheral region GA of the substrate 21. The cathode wiring 60 is provided surrounding the pixels Pix in the display region AA and the drive circuits 12 in the peripheral region GA. Cathodes of a plurality of light-emitting elements 3 are coupled to the common cathode wiring 60 and are supplied with a fixed potential (e.g., a ground potential). More specifically, a cathode electrode 33 (refer to FIG. 4) of the light-emitting element 3 is coupled to the cathode wiring 60 via a columnar conductor 25 and a mounting electrode 24 (refer to FIG. 4) formed on the array substrate 2.

Figure 2:
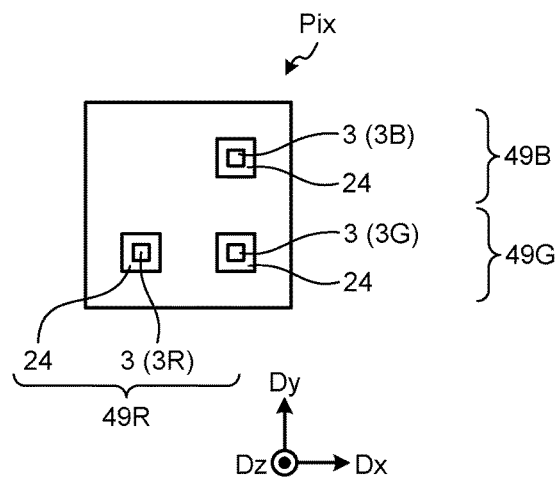
FIG. 2 is a plan view of a plurality of pixels.

FIG. 2 is a plan view of a plurality of pixels. As illustrated in FIG. 2, one pixel Pix includes a plurality of sub-pixels 49. The pixel Pix includes a sub-pixel 49R, a sub-pixel 49G, and a sub-pixel 49B, for example. The sub-pixel 49R displays a primary color of red as the first color. The sub-pixel 49G displays a primary color of green as the second color. The sub-pixel 49B displays a primary color of blue as the third color. As illustrated in FIG. 2, the sub-pixel 49R and the sub-pixel 49G in one pixel Pix are adjacently disposed in the first direction Dx. The sub-pixel 49G and the sub-pixel 49B are adjacently disposed in the second direction Dy. The first color, the second color, and the third color are not limited to red, green, and blue, respectively, and may be any desired colors, such as complementary colors. In the following description, the sub-pixel 49R, the sub-pixel 49G, and the sub-pixel 49B are simply referred to as the sub-pixels 49 when they need not be distinguished from one another.

Each sub-pixel 49 includes the light-emitting element 3 and the mounting electrode 24. To make the drawing easy to see, FIG. 2 schematically illustrates one mounting electrode 24 provided for one light-emitting element 3. In an actual configuration, however, a plurality of the mounting electrodes 24 are provided for one light-emitting element 3 corresponding to anode electrodes 32 and the cathode electrode 33 (refer to FIG. 4). The display device 1 displays an image by causing the light-emitting elements 3R, 3G, and 3B in the sub-pixels 49R, 49G, and 49B, respectively, to output different lights. The light-emitting element 3 is an inorganic light-emitting diode (LED) chip having a size of approximately 3 µm to 300 µm in planar view and is called a micro LED. The display device 1 including micro LEDs in respective pixels is also called a micro LED display device. The term "micro" of the micro LED is not intended to limit the size of the light-emitting element 3.

The light-emitting elements 3 may output different lights in four or more colors. The arrangement of the sub-pixels 49 is not limited to the configuration illustrated in FIG. 2. The sub-pixel 49R and the sub-pixel 49B, for example, may be disposed adjacently in the second direction Dy. Alternatively, the sub-pixels 49R, 49G, and 49B may be repeatedly arrayed in this order in the first direction Dx.

Figure 3:
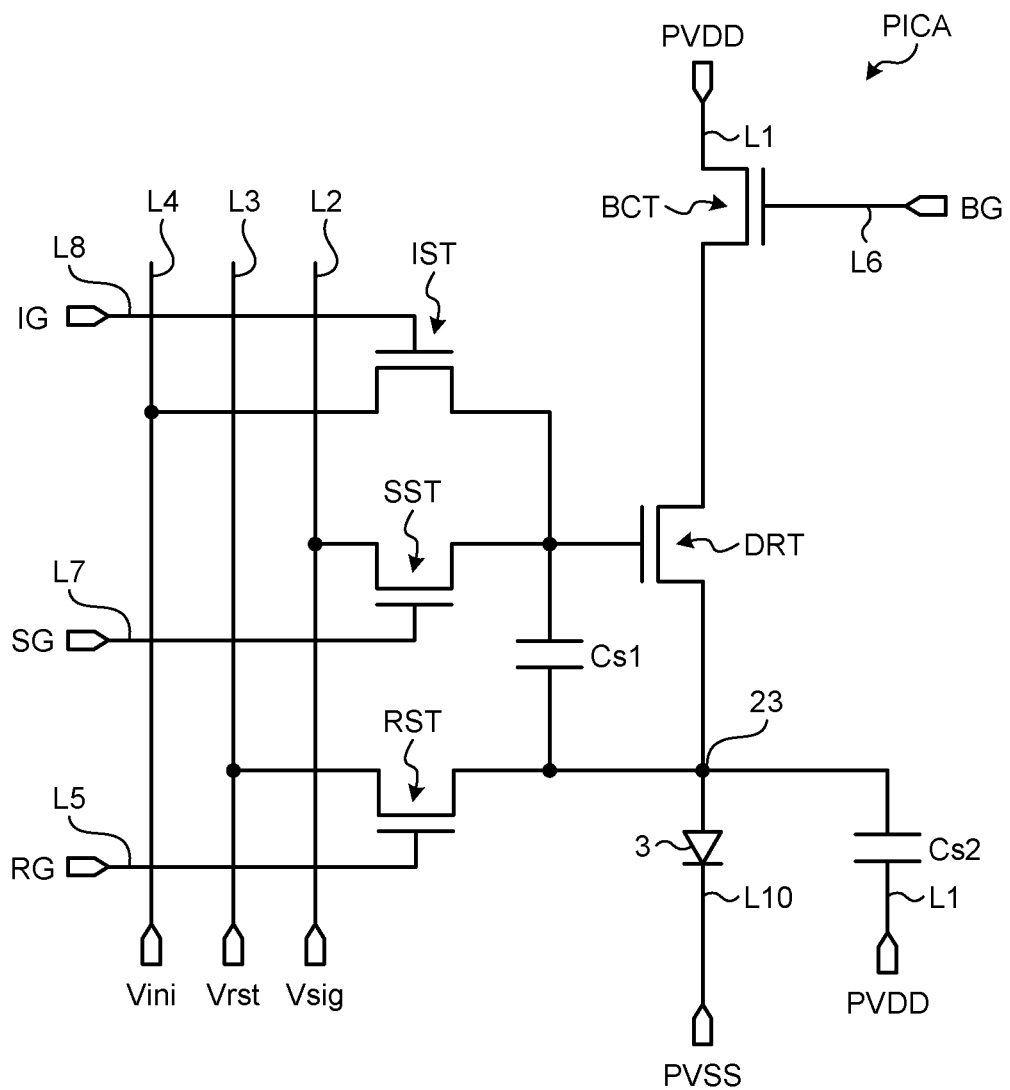
FIG. 3 is a circuit diagram of a pixel circuit.

FIG. 3 is a circuit diagram of a pixel circuit. FIG. 3 illustrates a pixel circuit PICA provided to one sub-pixel 49, and a plurality of the pixel circuits PICA are provided to the respective sub-pixels 49. As illustrated in FIG. 3, the pixel circuit PICA includes the light-emitting element 3, five transistors, and two capacitances. Specifically, the pixel circuit PICA includes a drive transistor DRT, an output transistor BCT, an initialization transistor IST, a pixel selection transistor SST, and a reset transistor RST. The drive transistor DRT, the output transistor BCT, the initialization transistor IST, the pixel selection transistor SST, and the reset transistor RST are n-type thin-film transistors (TFTs). The pixel circuit PICA includes first capacitance Cs1 and second capacitance Cs2.

The cathode (cathode electrode 33) of the light-emitting element 3 is coupled to a cathode power supply line L10. The anode (anode electrode 32) of the light-emitting element 3 is coupled to an anode power supply line L1 via anode wiring 23, the drive transistor DRT, and the output transistor BCT. The anode power supply line L1 is supplied with an anode power supply potential PVDD. The cathode power supply line L10 is supplied with a cathode power supply potential PVSS via the cathode wiring 60 and the cathode electrode 33. The anode power supply potential PVDD is higher than the cathode power supply potential PVSS.

The anode power supply line L1 supplies the anode power supply potential PVDD serving as a drive potential to the sub-pixel 49. Specifically, the light-emitting element 3 ideally emits light by being supplied with a forward current (drive current) due to the potential difference between the anode power supply potential PVDD and the cathode power supply potential PVSS (PVDD-PVSS). In other words, the anode power supply potential PVDD has a potential difference for causing the light-emitting element 3 to emit light with respect to the cathode power supply potential PVSS. The anode electrode 32 of the light-emitting element 3 is electrically coupled to the anode wiring 23, and the second capacitance Cs2 is formed between the anode wiring 23 and the anode power supply line L1.

The source electrode of the drive transistor DRT is coupled to the anode electrode 32 of the light-emitting element 3 via the anode wiring 23, and the drain electrode thereof is coupled to the source electrode of the output transistor BCT. The gate electrode of the drive transistor DRT is coupled to the first capacitance Cs1, the drain electrode of the pixel selection transistor SST, and the drain electrode of the initialization transistor IST.

The gate electrode of the output transistor BCT is coupled to the output control signal line L6. The output control signal line L6 is supplied with output control signals BG. The drain electrode of the output transistor BCT is coupled to the anode power supply line L1.

The source electrode of the initialization transistor IST is coupled to the initialization power supply line L4. The initialization power supply line L4 is supplied with an initialization potential Vini. The gate electrode of the initialization transistor IST is coupled to the initialization control signal line L8. The initialization control signal line L8 is supplied with initialization control signals IG. In other words, when the initialization transistor IST is turned on, the gate electrode of the drive transistor DRT is coupled to the initialization power supply line L4 via the initialization transistor IST.

The source electrode of the pixel selection transistor SST is coupled to the video signal line L2. The video signal line L2 is supplied with video signals Vsig. The gate electrode of the pixel selection transistor SST is coupled to the pixel control signal line L7. The pixel control signal line L7 is supplied with pixel control signals SG.

The source electrode of the reset transistor RST is coupled to the reset power supply line L3. The reset power supply line L3 is supplied with a reset power supply potential Vrst. The gate electrode of the reset transistor RST is coupled to the reset control signal line L5. The reset control signal line L5 is supplied with reset control signals RG. The drain electrode of the reset transistor RST is coupled to the anode wiring 23 (anode electrode 32 of the light-emitting element 3) and the source electrode of the drive transistor DRT. A reset operation performed by the reset transistor RST resets the voltage held in the first capacitance Cs1 and the second capacitance Cs2.

The first capacitance Cs1 is formed between the drain electrode of the reset transistor RST and the gate electrode of the drive transistor DRT. The pixel circuit PICA can suppress, by the first capacitance Cs1 and the second capacitance Cs2, fluctuations in the gate voltage due to parasitic capacitance and leakage current in the drive transistor DRT.

In the following description, the anode power supply line L1 and the cathode power supply line L10 may be simply referred to as power supply lines. The video signal line L2, the reset power supply line L3, and the initialization power supply line L4 may be referred to as signal lines. The reset control signal line L5, the output control signal line L6, the pixel control signal line L7, and the initialization control signal line L8 may be referred to as gate lines.

The gate electrode of the drive transistor DRT is supplied with an electric potential corresponding to the video signal Vsig (or a gradation signal). In other words, the drive transistor DRT supplies an electric current corresponding to the video signal Vsig to the light-emitting element 3 based on the anode power supply potential PVDD supplied via the output transistor BCT. Thus, the anode power supply potential PVDD supplied to the anode power supply line L1 is lowered by the drive transistor DRT and the output transistor BCT. As a result, the anode electrode 32 of the light-emitting element 3 is supplied with an electric potential lower than the anode power supply potential PVDD.

A first electrode of the second capacitance Cs2 is supplied with the anode power supply potential PVDD via the anode power supply line L1, and a second electrode of the second capacitance Cs2 is supplied with an electric potential lower than the anode power supply potential PVDD. In other words, the first electrode of the second capacitance Cs2 is supplied with an electric potential higher than that supplied to the second electrode of the second capacitance Cs2. The first electrode of the second capacitance Cs2 is a counter electrode 26 coupled to the anode power supply line L1 illustrated in FIG. 4, for example, and the second electrode of the second capacitance Cs2 is the anode wiring 23 coupled to the source of the drive transistor DRT illustrated in FIG. 4.

In the display device 1, the drive circuits 12 (illustrated in FIG. 1) select a plurality of pixel rows in order from the first row (e.g., the uppermost pixel row in the display region AA in FIG. 1). The drive IC 210 writes the video signals Vsig (video writing potential) to the sub-pixels 49 of the selected pixel row, thereby causing the light-emitting elements 3 to emit light. The drive IC 210 supplies the video signals Vsig to the video signal line L2, supplies the reset power supply potential Vrst to the reset power supply line L3, and supplies the initialization potential Vini to the initialization power supply line L4 in each horizontal scanning period. The display device 1 repeats these operations for each image of one frame.

Figure 4:
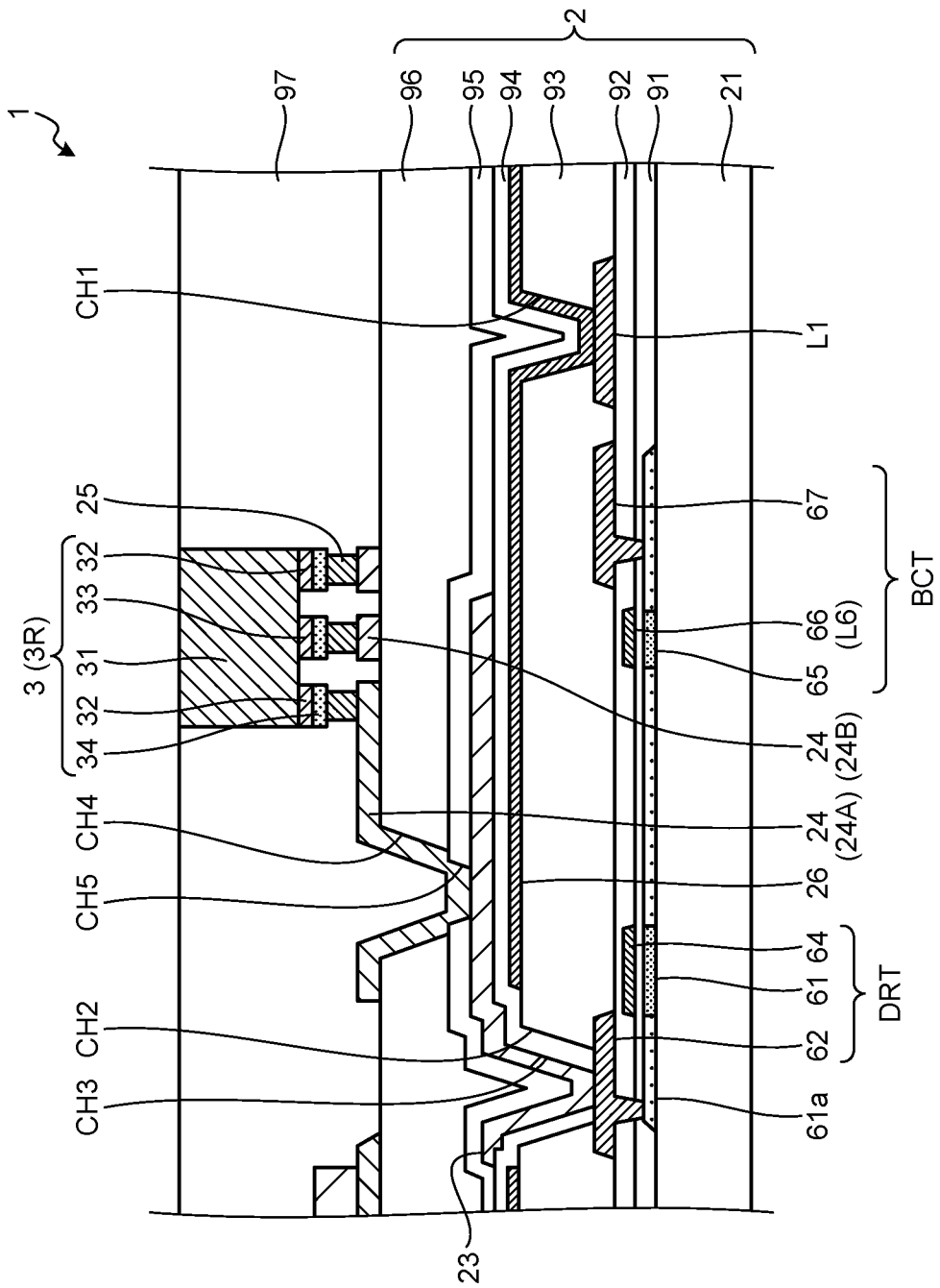
FIG. 4 is a sectional view along line IV-IV' of FIG. 1.

The following describes a sectional configuration of the display device 1. FIG. 4 is a sectional view along line IV-IV' of FIG. 1. As illustrated in FIG. 4, the light-emitting element 3 is provided on the array substrate 2. The array substrate 2 includes the substrate 21, various transistors, various kinds of wiring, and various insulating films. The substrate 21 is an insulating substrate and is a glass substrate, a resin substrate, or a resin film, for example.

In the present specification, a direction from the substrate 21 toward the light-emitting element 3 in a direction perpendicular to the surface of the substrate 21 is referred to as an "upper side" or simply as "top". A direction from the light-emitting element 3 toward the substrate 21 is referred to as a "lower side" or simply as "bottom".

The drive transistor DRT and the output transistor BCT are provided on one surface of the substrate 21. Semiconductor layers 61 and 65 are provided on the substrate 21. An undercoat film may be provided between the semiconductor layers 61 and 65 and the substrate 21. An insulating film 91 is provided on the substrate 21 to cover the semiconductor layers 61 and 65. The insulating film 91 is a silicon oxide film, for example.

Gate electrodes 64 and 66 are provided on the insulating film 91. In the example illustrated in FIG. 4 the transistors have what is called a top-gate structure. Alternatively, the transistors may have a bottom-gate structure in which the gate electrode is provided under the semiconductor layer or a dual-gate structure in which the gate electrodes are provided both on and under the semiconductor layer.

An insulating film 92 is provided on the insulating film 91 to cover the gate electrodes 64 and 66. The insulating film 92 has a multilayered structure composed of a silicon nitride film and a silicon oxide film, for example. A source electrode 62, a drain electrode 67, and the anode power supply line L1 are provided on the insulating film 92. The source electrode 62 is electrically coupled to the semiconductor layer 61 through a contact hole passing through the insulating films 91 and 92. The drain electrode 67 is electrically coupled to the semiconductor layer 65 through a contact hole formed in the insulating films 91 and 92.

A plurality of insulating films (a first organic insulating film 93, an insulating film 94, an insulating film 95, and a second organic insulating film 96) are provided to cover the transistors. The first organic insulating film 93 and the second organic insulating film 96 are made of organic material, such as photosensitive acrylic. The organic material, such as photosensitive acrylic, is excellent in coverability for covering a difference in level of wiring and flatness on the surface compared with inorganic insulating material formed by chemical vapor deposition (CVD), for example. The insulating films 94 and 95 are inorganic insulating films and may be made of the same material, such as a silicon nitride film, as that of the insulating films 91 and 92.

Specifically, the first organic insulating film 93 is provided on the insulating film 92 to cover the source electrode 62, the drain electrode 67, and the anode power supply line L1. The counter electrode 26, the insulating film 94, and the anode wiring 23 are stacked in this order on the first organic insulating film 93. The counter electrode 26 is made of translucent conductive material, such as indium tin oxide (ITO). The counter electrode 26 is coupled to the anode power supply line L1 at the bottom of a contact hole CH1 formed in the first organic insulating film 93.

The insulating film 94 is provided to cover the counter electrode 26. The anode wiring 23 faces the counter electrode 26 with the insulating film 94 interposed therebetween. The first organic insulating film 93 and the insulating film 94 have contact holes CH2 and CH3 the bottom of which is formed by the source electrode 62. The anode wiring 23 is electrically coupled to the source electrode 62 through the contact holes CH2 and CH3. As a result, the anode wiring 23 is electrically coupled to the drive transistor DRT.

The anode wiring 23 has a multilayered structure of titanium (Ti) and aluminum (Al), for example. The material is not limited thereto, and the anode wiring 23 may have a multilayered structure of Al and material including at least one of metals of molybdenum (Mo) and Ti. Alternatively, the anode wiring 23 may be made of alloy including at least one of Mo and Ti or translucent conductive material. The second capacitance Cs2 is formed between the anode wiring 23 and the counter electrode 26 facing each other with the insulating film 94 interposed therebetween.

The insulating film 95 is provided on the insulating film 94 to cover the anode wiring 23. The second organic insulating film 96 is provided on the insulating film 95. In other words, the first organic insulating film 93 is provided on the drive transistor DRT, and the second organic insulating film 96 is stacked on the first organic insulating film 93. The insulating film 95 is provided between the first organic insulating film 93 and the second organic insulating film 96. The second organic insulating film 96 has a contact hole CH4. The insulating film 95 has a contact hole CH5 overlapping the contact hole CH4. The anode wiring 23 is provided at the bottom of the contact holes CH4 and CH5. The anode wiring 23 is provided facing at least part of the mounting electrode 24.

The mounting electrode 24 is provided on the second organic insulating film 96 and is electrically coupled to the anode wiring 23 through the contact holes CH4 and CH5. The mounting electrode 24 has a multilayered structure of Ti and Al similarly to the anode wiring 23. The mounting electrode 24 may be made of conductive material different from that of the anode wiring 23. The second organic insulating film 96 may be made of organic material different from that of the first organic insulating film 93.

The light-emitting element 3 (3R) is mounted on the mounting electrode 24. While FIG. 4 illustrates the light-emitting element 3R, the other light-emitting elements 3G and 3B (not illustrated in FIG. 4) are also mounted on the respective mounting electrodes 24. FIG. 4 schematically illustrates the configuration of the light-emitting element 3 and the coupling configuration between the light-emitting element 3 and the array substrate 2, and detailed explanation thereof will be given with reference to FIGS. 5 and 6.

The light-emitting element 3 includes a semiconductor layer 31, the anode electrode 32, and the cathode electrode 33. The light-emitting element 3 is a flip-chip light-emitting element in which the anode electrode 32 (p-type electrode) and the cathode electrode 33 (n-type electrode) are provided on the same surface facing the array substrate 2. The light-emitting element 3 includes the anode electrodes 32 and one cathode electrode 33. The cathode electrode 33 is disposed between the anode electrodes 32. Coupling members 34 are provided to cover the anode electrodes 32 and the cathode electrode 33.

The mounting electrodes 24 include a first mounting electrode 24A facing the anode electrode 32 and a second mounting electrode 24B facing the cathode electrode 33.

The mounting electrodes 24 are each provided with a columnar conductor 25 used for coupling. The columnar conductor 25 is a columnar member extending in a direction perpendicular to the array substrate 2 (substrate 21). The lower ends (ends on the array substrate 2 side) of the columnar conductors 25 are coupled to the respective mounting electrodes 24, and the upper ends (ends on the light-emitting element 3 side) of the columnar conductors 25 are coupled to the coupling members 34. As a result, the anode electrodes 32 and the cathode electrode 33 are each electrically coupled to the mounting electrode 24 via the columnar conductor 25 and the coupling member 34.

A sealing member 97 is provided between the light-emitting elements 3. The sealing member 97 is made of insulating resin material. The sealing member 97 is provided between the lower surfaces of the light-emitting elements 3 and the array substrate 2 and covers the side surfaces of the light-emitting elements 3. The sealing member 97 is formed flat such that the upper surface of the sealing member 97 and the upper surfaces of the light-emitting elements 3 form the same plane. The position of the upper surface of the sealing member 97 may be different from the positions of the upper surfaces of the light-emitting elements 3, and the sealing member 97 may cover the periphery of the upper surfaces of the light-emitting elements 3.

Figure 5:
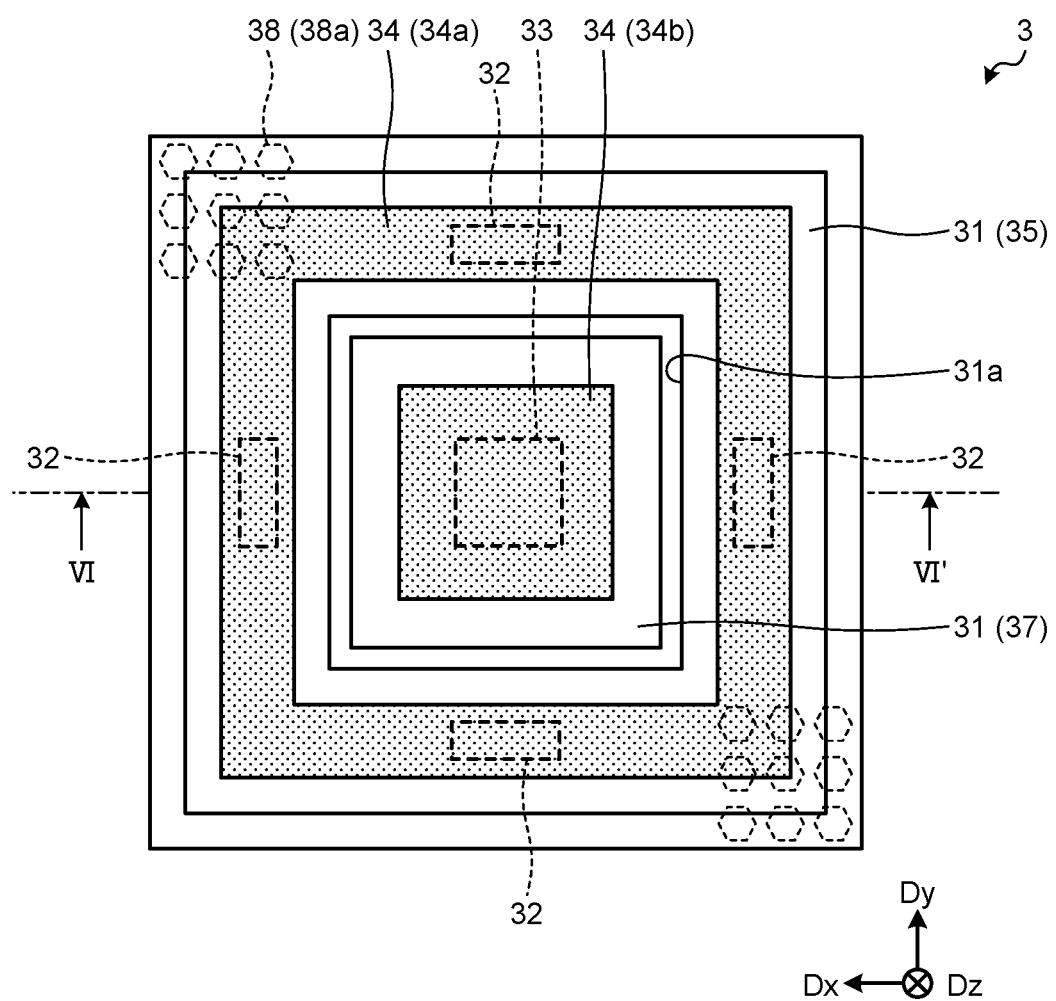
FIG. 5 is a plan view schematically illustrating a light-emitting element.

FIG. 5 is a plan view schematically illustrating the light-emitting element. FIG. 5 is a plan view of the light-emitting element 3 viewed from the lower surface (that is, the surface facing the array substrate 2). As illustrated in FIG. 5, the semiconductor layer 31 of the light-emitting element 3 has a quadrilateral shape in planar view. The shape of the semiconductor layer 31 is not limited thereto and may be other shapes, such as rectangular, polygonal, and circular shapes, in planar view.

As illustrated in FIG. 5, the light-emitting element 3 (semiconductor layer 31) has a recess 31a at the center of the lower surface. The anode electrodes 32 (first electrode) are provided in the region where the recess 31a is not formed on the lower surface of the semiconductor layer 31. A total of four anode electrodes 32 are provided, one on each side of the semiconductor layer 31. The cathode electrode 33 (second electrode) is provided at the bottom of the recess 31a.

The cathode electrode 33 is disposed between the two anode electrodes 32 in the first direction Dx in planar view. The cathode electrode 33 is disposed between the two anode electrodes 32 in the second direction Dy.

The coupling members 34 are provided to cover the anode electrodes 32 and the cathode electrode 33. In FIG. 5, the coupling members 34 are hatched to make the drawing easy to see. The coupling members 34 include a first coupling member 34a covering the anode electrodes 32 and a second coupling member 34b covering the cathode electrode 33. The first coupling member 34a is formed into an annular shape surrounding the second coupling member 34b and the cathode electrode 33. The second coupling member 34b is formed inside the recess 31a.

In the following description, the first coupling member 34a and the second coupling member 34b are simply referred to as the coupling members 34 when they need not be distinguished from each other. The first coupling member 34a does not necessarily have a continuous annular shape and may be divided into a plurality of parts to cover the respective anode electrodes 32.

With this configuration, the anode electrodes 32 and the cathode electrode 33 are symmetrically disposed in the first direction Dx and the second direction Dy. This configuration can prevent the light-emitting element 3 from being coupled to the array substrate 2 in an inclined manner if the cathode electrode 33 is formed in the recess 31a.

The number, the shape, and the position of the anode electrodes 32 and the cathode electrode 33 are given by way of example only and may be appropriately modified. The number of anode electrodes 32, for example, is not limited to four. It simply needs to be at least one and may be five or more. While the shapes of the anode electrodes 32 and the cathode electrode 33 are quadrilaterals in planar view, they are not limited thereto. The anode electrodes 32 and the cathode electrode 33 may have other shapes, such as rectangular, polygonal, and circular shapes.

In FIG. 5, dotted lines represent a plurality of micro recesses 38a in a high-resistance layer 38 formed on the upper surface (that is, the surface opposite to the surface facing the array substrate 2) of the light-emitting element 3. To make the drawing easy to see, FIG. 5 illustrates only some of the micro recesses 38a. In an actual configuration, however, the micro recesses 38a are arrayed across the entire upper surface of the light-emitting element 3.

Figure 6:
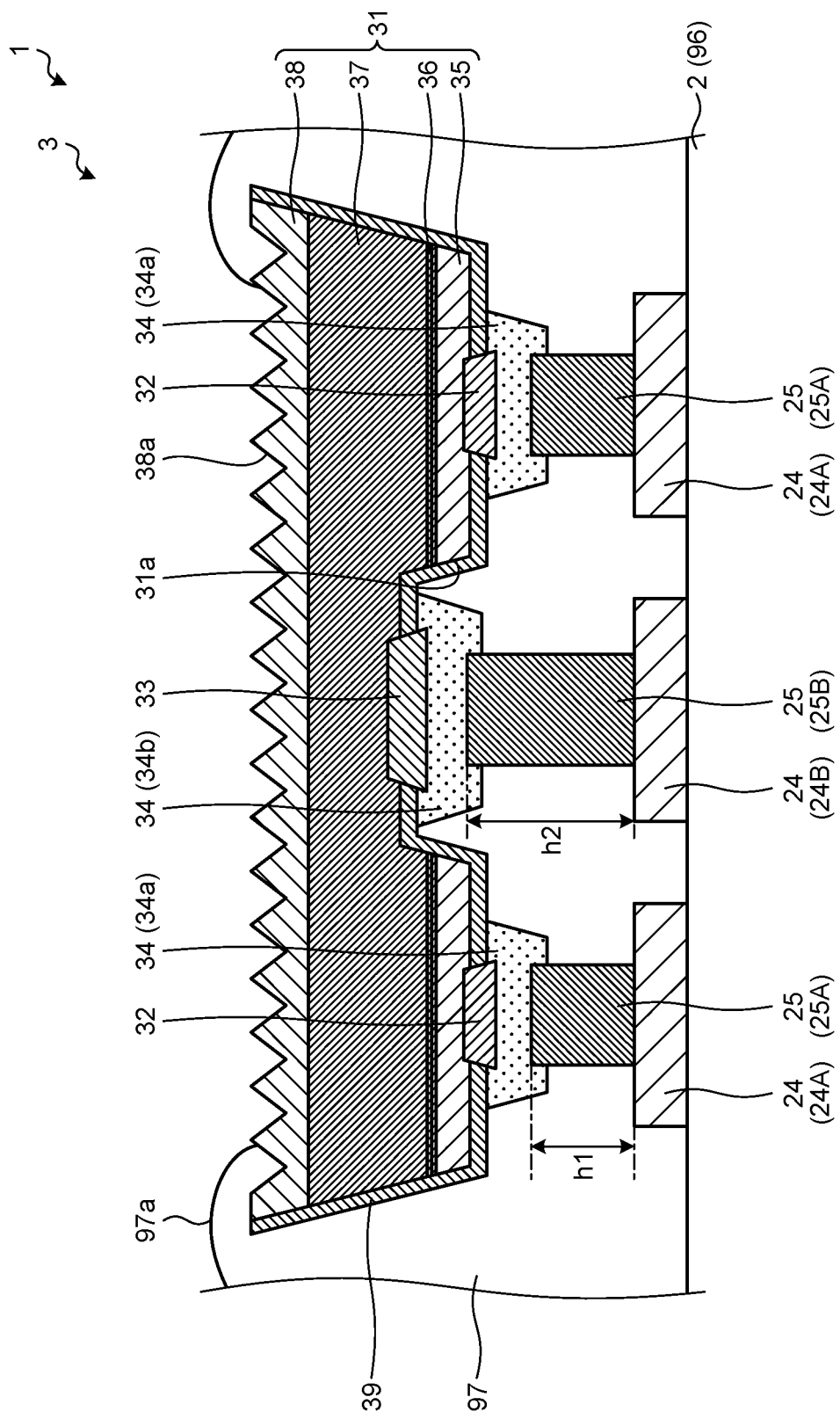
FIG. 6 is a sectional view schematically illustrating a coupling configuration between the light-emitting element and an array substrate.

FIG. 6 is a sectional view schematically illustrating a coupling configuration between the light-emitting element and the array substrate. FIG. 6 is a sectional view along line VI-VI' of FIG. 5, for example. As illustrated in FIG. 6, the semiconductor layer 31 of light-emitting element 3 is composed of the high-resistance layer 38, an n-type cladding layer 37, an active layer 36, and a p-type cladding layer 35. In the semiconductor layer 31, the p-type cladding layer 35, the active layer 36, the n-type cladding layer 37, and the high-resistance layer 38 are stacked in this order from the array substrate 2 side. The semiconductor layer 31 is made of a compound semiconductor, such as gallium nitride (GaN), aluminum indium phosphide (AlInP), and indium gallium nitride (InGaN). The semiconductor layer 31 may be made of different materials depending on the light-emitting elements 3R, 3G, and 3B.

The active layer 36 has a multi-quantum well structure (MQW structure) in which well layers and barrier layers composed of several atomic layers are cyclically stacked for high efficiency. The recess 31a of the semiconductor layer 31 passes through the p-type cladding layer 35 and the active layer 36, and the n-type cladding layer 37 is exposed at the bottom of the recess 31a (the surface positioned on the upper side in the recess 31a in FIG. 6). The cathode electrode 33 is coupled to the n-type cladding layer 37 in the recess 31a. The anode electrodes 32 are coupled to the p-type cladding layer 35 in the region where the recess 31a is not formed on the lower surface of the semiconductor layer 31.

The high-resistance layer 38 is formed to cover the entire upper surface of the n-type cladding layer 37. The high-resistance layer 38 is made of semiconductor material (e.g., gallium nitride (GaN)) not doped with impurities. The sheet resistance of the high-resistance layer 38 is higher than that of the n-type cladding layer 37.

The high-resistance layer 38 has the micro recesses 38a on the upper surface. The micro recesses 38a are formed by transferring the surface shape of a sapphire substrate having a patterned sapphire substrate (PSS) structure (refer to FIG. 9). The micro recess 38a is formed into a hexagonal pyramidal shape. In other words, each micro recess 38a has a hexagonal opening in planar view (refer to FIG. 5) and has a tapered shape formed by inclining side walls. With the micro recesses 38a, the light-emitting element 3 can suppress reflection of external light, thereby suppressing deterioration of display quality.

The shape of the micro recess 38a is not limited to a hexagonal pyramid and may be other shapes, such as a cone and a triangular pyramid. The micro recesses 38*a* are arrayed in a matrix (row-column configuration) in planar view. The present embodiment is not limited thereto, and the micro recesses 38*a* may be arrayed in other patterns, such as a triangular grid. The high-resistance layer 38 is not necessarily provided to cover the entire upper surface of the n-type cladding layer 37 and may not be formed at part of the upper surface of the n-type cladding layer 37.

The lower surface and the side surfaces of the light-emitting element 3 are covered with a protective insulating film 39 (e.g., silicon nitride (SiN), aluminum oxide ($Al_2O_3$), or silicon oxide ($SiO_2$)). The insulating film 39 also covers the recess 31*a* of the semiconductor layer 31. The anode electrodes 32 and the cathode electrode 33 are coupled to the p-type cladding layer 35 and the n-type cladding layer 37, respectively, through contact holes formed in the insulating film 39.

The coupling members 34 (the first coupling member 34*a* and the second coupling member 34*b*) are coupled to the anode electrode 32 and the cathode electrode 33, respectively, as described above. The width of the first coupling member 34*a* is larger than that of the anode electrode 32. The width of the second coupling member 34*b* is larger than that of the cathode electrode 33. The coupling member 34 is made of material having hardness (Mohs hardness) lower than that of the surrounding metal materials, such as the columnar conductor 25, the anode electrode 32, and the cathode electrode 33. The coupling member 34 is made of metal material containing at least one of tin (Sn) and indium (In), for example.

The volume of the second coupling member 34*b* is smaller than that of the space in the recess 31*a* of the semiconductor layer 31. The height of the second coupling member 34*b* is lower than that of the recess 31*a* of the semiconductor layer 31. The width of the second coupling member 34*b* at the bottom of the recess 31*a* is smaller than that of the recess 31*a* of the semiconductor layer 31. This configuration can prevent the second coupling member 34*b* from flowing outside the recess 31*a* if the second coupling member 34*b* is made of flexible material and is deformed in the process of coupling it to the columnar conductor 25. As a result, the present embodiment can suppress a short circuit between the second coupling member 34*b* coupled to the cathode electrode 33 and the first coupling member 34*a* coupled to the anode electrode 32.

The array substrate 2 is provided with the mounting electrodes 24 (the first mounting electrode 24A and the second mounting electrode 24B) and the columnar conductors 25 described above. The columnar conductors 25 are columnar members extending in a direction perpendicular to the array substrate 2. The columnar conductors 25 are made of material (e.g., tungsten (W)) harder than the coupling members 34.

The columnar conductors 25 include a first columnar conductor 25A electrically coupled to the anode electrode 32 and a second columnar conductor 25B electrically coupled to the cathode electrode 33. The lower end (end on the array substrate 2 side) of the first columnar conductor 25A is coupled to the first mounting electrode 24A, and the upper end (end on the light-emitting element 3 side) of the first columnar conductor 25A is directly coupled to the first coupling member 34*a*. As a result, the anode electrode 32 is electrically coupled to the first mounting electrode 24A. The lower end (end on the array substrate 2 side) of the second columnar conductor 25B is coupled to the second mounting electrode 24B, and the upper end (end on the light-emitting element 3 side) of the second columnar conductor 25B is directly coupled to the second coupling member 34*b*. As a result, the cathode electrode 33 is electrically coupled to the second mounting electrode 24B.

In other words, in the region overlapping the anode electrode 32, the first mounting electrode 24A, the first columnar conductor 25A, the first coupling member 34*a*, the anode electrode 32, and the semiconductor layer 31 (p-type cladding layer 35) of the light-emitting element 3 are stacked in this order in the direction perpendicular to the array substrate 2. In the region overlapping the cathode electrode 33, the second mounting electrode 24B, the second columnar conductor 25B, the second coupling member 34*b*, the cathode electrode 33, and the semiconductor layer 31 (n-type cladding layer 37) of the light-emitting element 3 are stacked in this order in the direction perpendicular to the array substrate 2.

A height h1 of the first columnar conductor 25A according to the present embodiment is lower than a height h2 of the second columnar conductor 25B. The width of the first columnar conductor 25A is smaller than that of the first coupling member 34*a*. The part of the first coupling member 34*a* coupled to the first columnar conductor 25A has a recess. Similarly, the width of the second columnar conductor 25B is smaller than that of the second coupling member 34*b*. The part of the second coupling member 34*b* coupled to the second columnar conductor 25B has a recess. This configuration can secure the coupling stability between the anode electrode 32 and the cathode electrode 33 of the light-emitting element 3 and the first mounting electrode 24A and the second mounting electrode 24B of the array substrate 2, respectively, if the anode electrode 32 and the cathode electrode 33 of the light-emitting element 3 are formed at different height positions.

The difference between the height h1 of the first columnar conductor 25A and the height h2 of the second columnar conductor 25B is set according to the difference in height position between the anode electrode 32 and the cathode electrode 33 (that is, the height of the recess 31*a*). If there is variation in the height of the first columnar conductor 25A and the second columnar conductor 25B, the coupling members 34 having hardness lower than that of the first columnar conductor 25A and the second columnar conductor 25B flexibly deform to absorb the variation in the height of the columnar conductors 25, thereby securing the coupling stability.

The sealing member 97 is provided between the light-emitting element 3 and the array substrate 2 to fill the space around the columnar conductors 25. The sealing member 97 is provided to cover the side surfaces of the light-emitting element 3 and the periphery of the upper surface of the light-emitting element 3. More specifically, the sealing member 97 covers some of the micro recesses 38*a* at the periphery of the high-resistance layer 38. This configuration can increase the strength of coupling between the light-emitting element 3 and the array substrate 2.

The columnar conductor 25 is formed into a column or a prism (e.g., a triangular or quadrangular prism). The shape of the columnar conductor 25 is not limited thereto and may be other shapes, such as a cone and a pyramid.

First Modification of the First Embodiment

Figure 7:
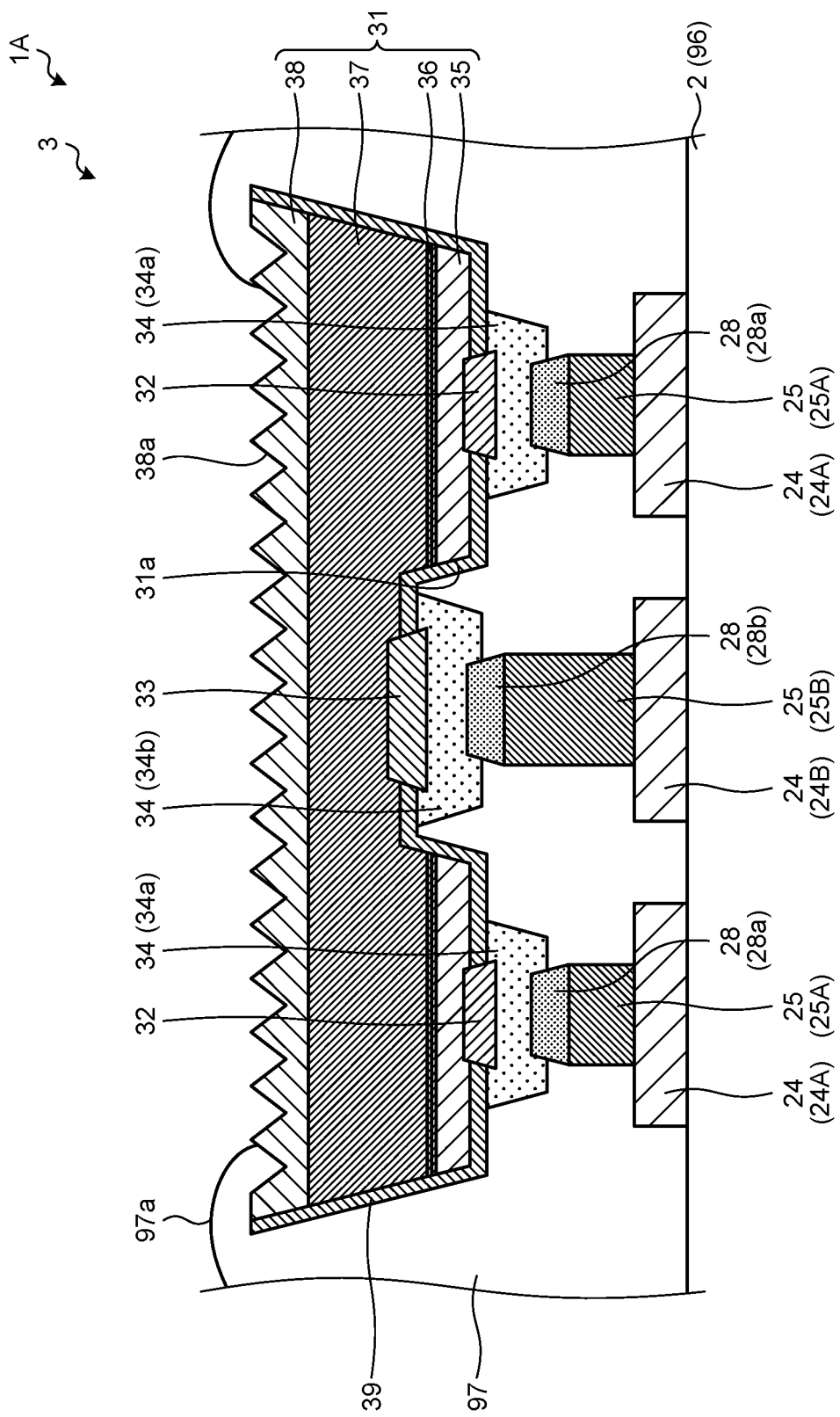
FIG. 7 is a sectional view schematically illustrating a coupling configuration between the light-emitting element and the array substrate according to a first modification of the first embodiment.

FIG. 7 is a sectional view schematically illustrating a coupling configuration between the light-emitting element and the array substrate according to a first modification of the first embodiment. In the following description, the same components as those described in the embodiment above are denoted by like reference numerals, and overlapping explanation thereof is omitted.

As illustrated in FIG. 7, a display device 1A according to the first modification includes columnar conductor coupling members 28 at the upper ends (ends on the light-emitting element 3 side) of the respective columnar conductors 25. The columnar conductor coupling member 28 is made of material having hardness lower than that of the columnar conductor 25. More preferably, the columnar conductor coupling member 28 is made of the same material as that of the coupling member 34 of the light-emitting element 3. The columnar conductor coupling member 28 is made of metal material containing at least one of tin (Sn) and indium (In), for example.

A first columnar conductor coupling member 28a is provided at the upper end of the first columnar conductor 25A, and the first columnar conductor coupling member 28a is in contact with the first coupling member 34a of the light-emitting element 3. A second columnar conductor coupling member 28b is provided at the upper end of the second columnar conductor 25B, and the second columnar conductor coupling member 28b is in contact with the second coupling member 34b of the light-emitting element 3. The widths of the first columnar conductor coupling member 28a and the second columnar conductor coupling member 28b are smaller than the widths of the first coupling member 34a and the second coupling member 34b, respectively.

The first modification can improve the coupling stability between the light-emitting element 3 and the array substrate 2 because the columnar conductor coupling members 28 and the coupling members 34 made of the same material are in contact with each other.

Second Modification of the First Embodiment

Figure 8:
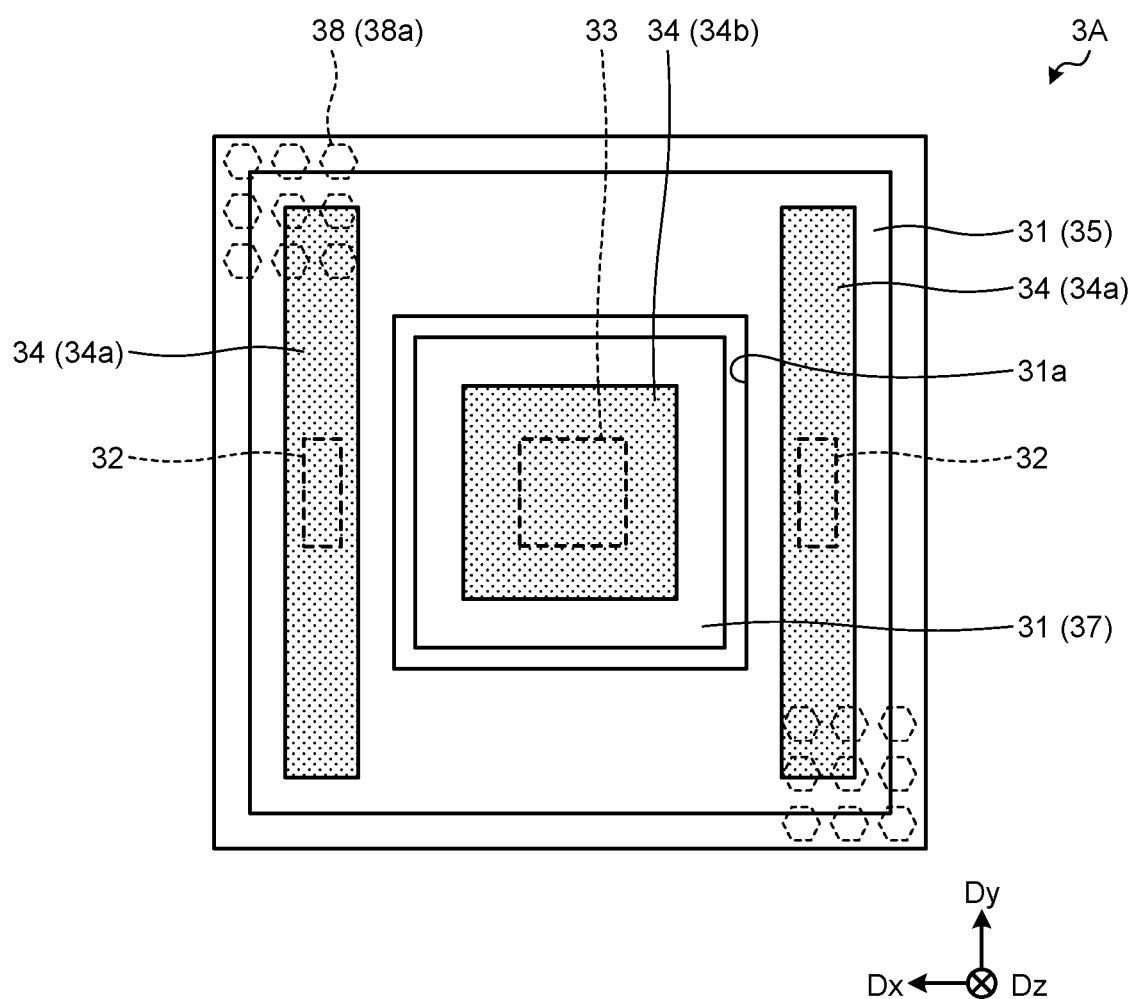
FIG. 8 is a plan view schematically illustrating the light-emitting element according to a second modification of the first embodiment.

FIG. 8 is a plan view schematically illustrating the light-emitting element according to a second modification of the first embodiment. A light-emitting element 3A according to the second modification is different from the light-emitting element 3 according to the first embodiment in the number of anode electrodes 32.

As illustrated in FIG. 8, two anode electrodes 32 are adjacently disposed in the first direction Dx, and the cathode electrode 33 is disposed between the anode electrodes 32 adjacently disposed in the first direction Dx. The first coupling members 34a extend in the second direction Dy to cover the respective anode electrodes 32. No anode electrode 32 or no first coupling member 34a is provided at the positions adjacent to the cathode electrode 33 in the second direction Dy.

The second modification can also prevent the light-emitting element 3 from being coupled to the array substrate 2 in an inclined manner because the anode electrodes 32 and the cathode electrode 33 are symmetrically disposed at least in the first direction Dx.

Method for Manufacturing the Display Device

Figure 9:
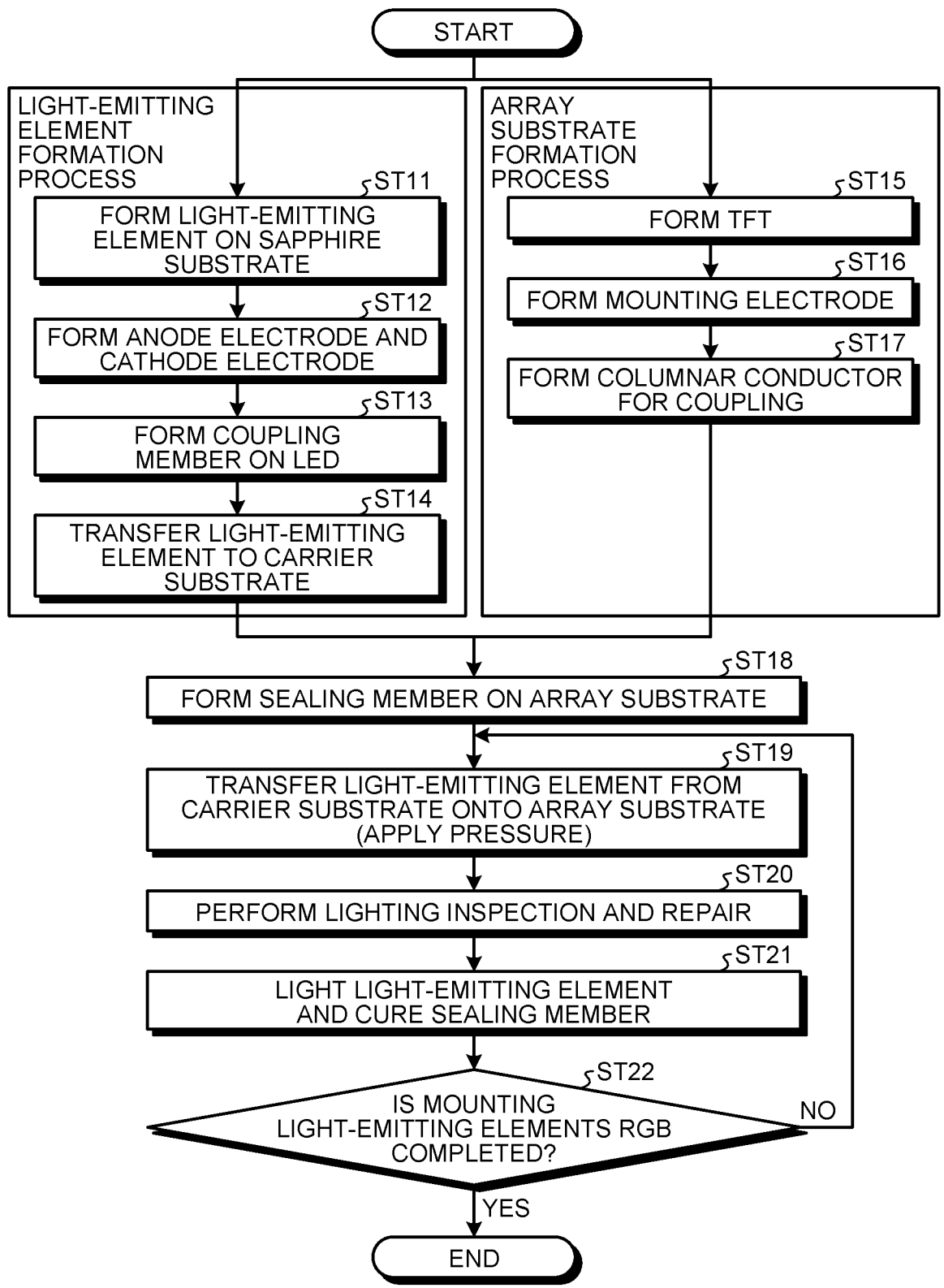
FIG. 9 is a flowchart for explaining a method for manufacturing the display device according to the first embodiment.

FIG. 9 is a flowchart for explaining a method for manufacturing the display device according to the first embodiment. As illustrated in FIG. 9, the method for manufacturing the display device includes a light-emitting element formation process (Steps ST11 to ST14) and an array substrate formation process (Steps ST15 to ST17).

In the light-emitting element formation process, a manufacturing apparatus forms the semiconductor layer 31 on a sapphire substrate (Step ST11). Specifically, the manufacturing apparatus forms the high-resistance layer 38, the n-type cladding layer 37, the active layer 36, and the p-type cladding layer 35 in this order on a first surface of the sapphire substrate. The first surface of the sapphire substrate has a PSS structure.

Subsequently, the manufacturing apparatus patterns the semiconductor layer 31 to form the recess 31a and forms the anode electrodes 32 (first electrode) and the cathode electrode 33 (second electrode) having different polarities and the insulating film 39 (Step ST12). The anode electrode 32 and the cathode electrode 33 may be made of different materials. As described above, the anode electrodes 32 are provided in the region where the recess 31a is not formed in the semiconductor layer 31. The cathode electrode 33 is provided in the region where the recess 31a is formed in the semiconductor layer 31.

Subsequently, the manufacturing apparatus forms the coupling members 34 to cover the anode electrodes 32 and the cathode electrode 33 (Step ST13).

Figure 10:
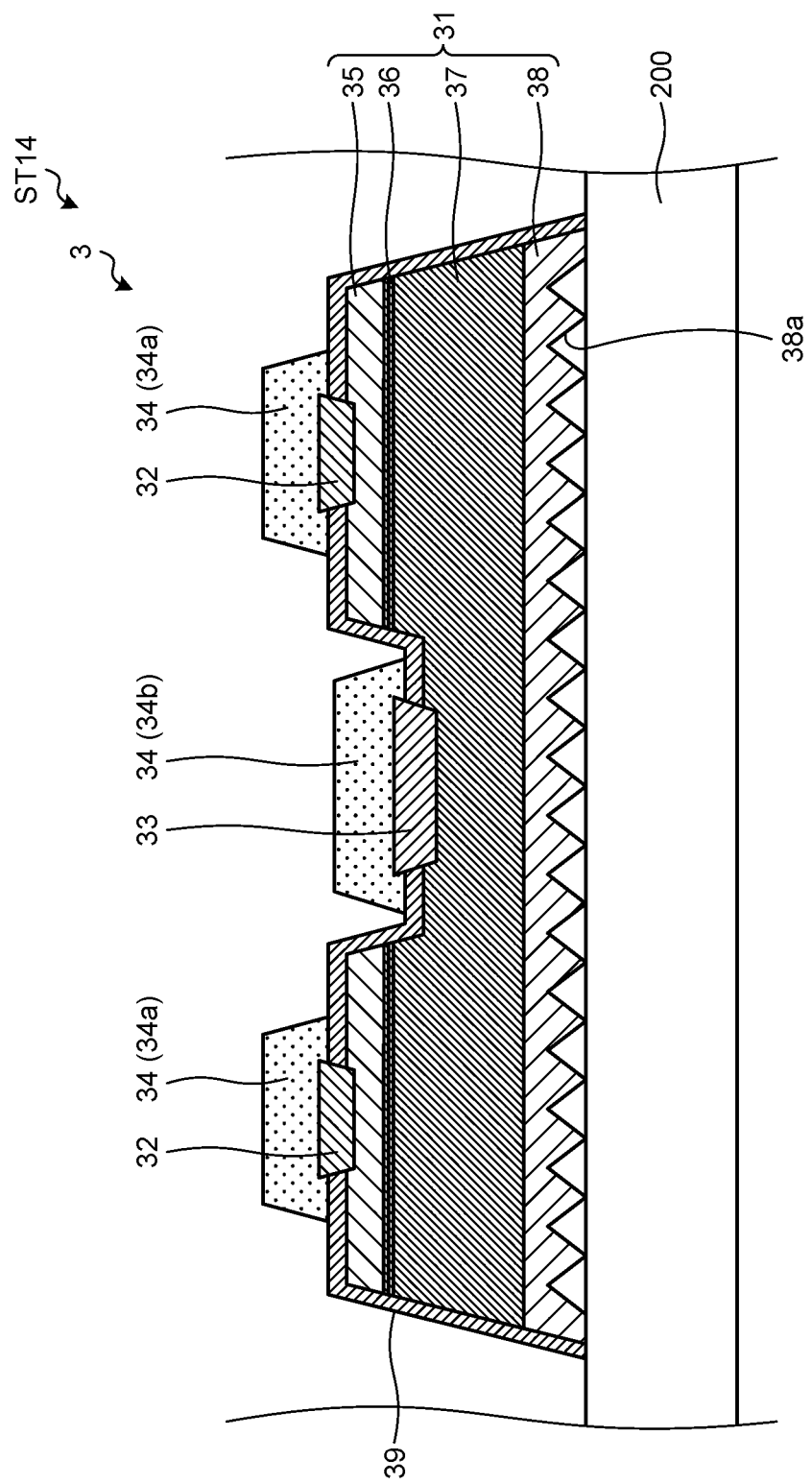
FIG. 10 is a sectional view schematically illustrating the light-emitting element at Step ST14 in FIG. 9.

Subsequently, the manufacturing apparatus transfers the light-emitting element 3 on the sapphire substrate to a carrier substrate 200 by laser lift-off or other methods (Step ST14). FIG. 10 is a sectional view schematically illustrating the light-emitting element at Step ST14 in FIG. 9. As illustrated in FIG. 10, the light-emitting element 3 is transferred at least twice from the sapphire substrate, and the high-resistance layer 38, the n-type cladding layer 37, the active layer 36, and the p-type cladding layer 35 are stacked in this order on the carrier substrate 200. In the light-emitting element formation process, the coupling members 34 are positioned on the uppermost surface of the light-emitting element 3, and the columnar conductors 25 are not formed on the light-emitting element 3. Therefore, the present embodiment can perform the transfer process in a simpler manner than a case where the columnar conductors 25 are formed on the light-emitting element 3. Alternatively, the present embodiment can prevent the columnar conductors 25 from being damaged in the transfer process compared with the case where the columnar conductors 25 are formed on the light-emitting element 3.

In the array substrate formation process, the manufacturing apparatus first forms the transistors, such as the drive transistor DRT, and the wiring on the substrate 21 (Step ST15).

Subsequently, the manufacturing apparatus forms the mounting electrodes 24 (the first mounting electrodes 24A and the second mounting electrode 24B) on the array substrate 2 (Step ST16). The first mounting electrodes 24A and the second mounting electrode 24B are patterned corresponding to the positions of the anode electrodes 32 and the cathode electrode 33, respectively, of the light-emitting element 3.

Figure 11:
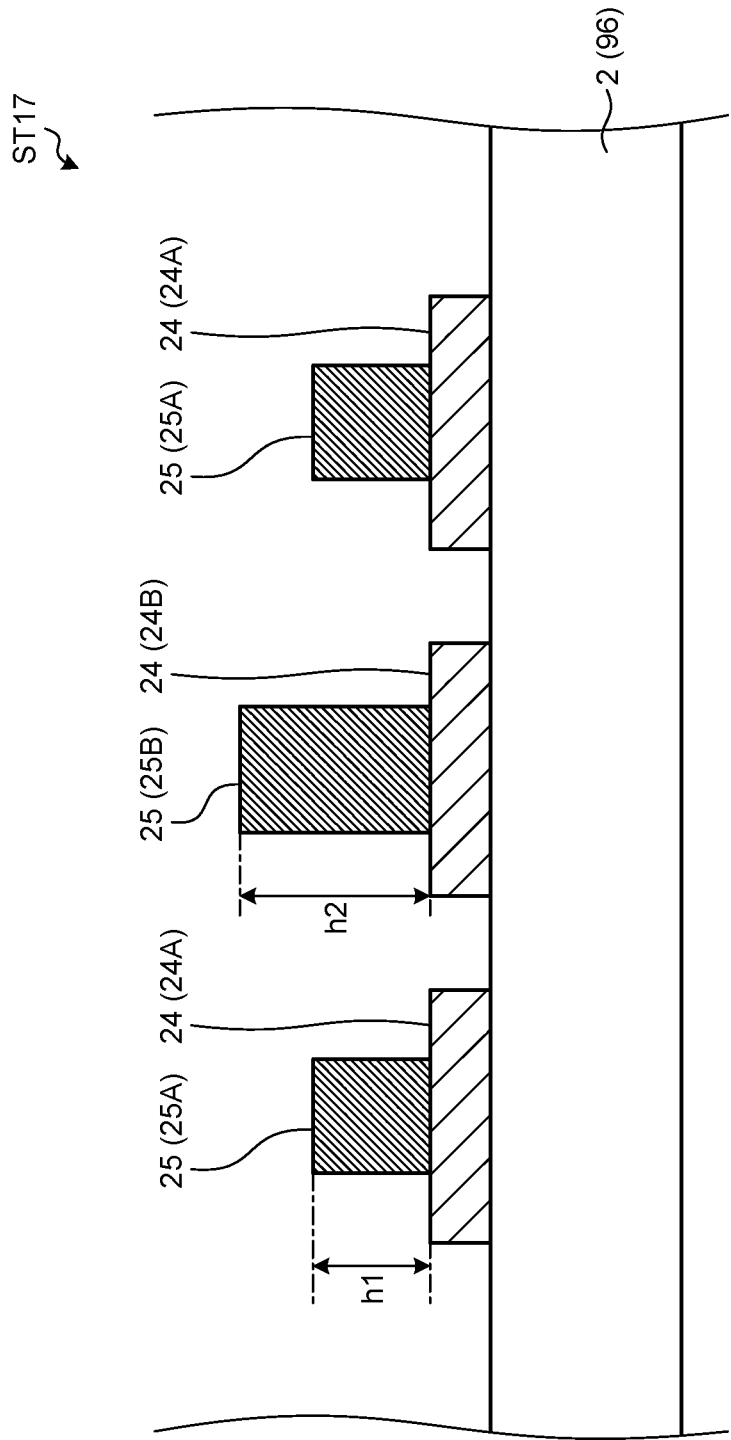
FIG. 11 is a sectional view schematically illustrating the array substrate at Step ST17 in FIG. 9.

Subsequently, the manufacturing apparatus forms the columnar conductors 25 (the first columnar conductors 25A and the second columnar conductor 25B) on the mounting electrodes 24 (the first mounting electrodes 24A and the second mounting electrode 24B) provided on the array substrate 2 (Step ST17). FIG. 11 is a sectional view schematically illustrating the array substrate at Step ST17 in FIG. 9. The first columnar conductors 25A and the second columnar conductor 25B are formed with different heights h1 and h2, respectively, corresponding to the height positions of the anode electrodes 32 and the cathode electrode 33 of the light-emitting element 3.

Subsequently, the manufacturing apparatus forms the sealing member 97 on the array substrate 2 to cover the columnar conductors 25 (Step ST18). The sealing member 97 is made of uncured resin material (e.g., epoxy resin).

Subsequently, the manufacturing apparatus places the carrier substrate 200 provided with the light-emitting element 3 (refer to FIG. 10) and the array substrate 2 provided with the columnar conductors 25 (refer to FIG. 11) in a manner facing each other, applies pressure to them, and transfers the light-emitting element 3 from the carrier substrate 200 to the array substrate 2 (Step ST19). As a result, the columnar conductors 25 of the array substrate 2 are coupled to the coupling members 34 of the light-emitting element 3.

As illustrated in FIGS. 6 and 10, the side surfaces of the light-emitting element 3 and the side surfaces of the recess 31a are inclined. Therefore, when the light-emitting element 3 is transferred to the array substrate 2 covered with the sealing member 97, the sealing member 97 flows along the side surfaces of the light-emitting element 3 and the side surfaces of the recess 31a. As a result, the sealing member 97 covers the side surfaces of the light-emitting element 3 and satisfactorily fills the recess 31a after the transfer.

Subsequently, the manufacturing apparatus performs a lighting inspection on the light-emitting element 3 by driving the pixel circuit PICA (refer to FIG. 3) of the array substrate 2 while the sealing member 97 is uncured (Step ST20). If there is a light-emitting element 3 that does not light up, the manufacturing apparatus replaces it with another light-emitting element 3 and performs repair.

After the lighting inspection and the repair are completed, the manufacturing apparatus lights the light-emitting element 3 by applying an electric current larger than that used for the lighting inspection (Step ST21). As a result, the sealing member 97 is cured by the heat of the lit light-emitting element 3. At this time, only the sealing member 97 around the lit light-emitting element 3 is cured, and the sealing member 97 formed in a region provided with no light-emitting element 3 remains uncured. If the light-emitting element 3R is mounted, and the light-emitting elements 3G and 3B are unmounted out of the light-emitting elements 3R, 3G, and 3B, for example, only the sealing member 97 around the light-emitting element 3R is cured at Step ST21. The sealing member 97 in the region corresponding to the light-emitting elements 3G and 3B is uncured. At Step ST21, the value of the electric current flowing through the light-emitting element 3 is set such that the heat of the light-emitting element 3 falls within a range of the temperature at which the sealing member 97 is cured (e.g., approximately 140° C. to 160° C.) to the melting point of the coupling member 34 (e.g., approximately 200° C.)

Subsequently, the manufacturing device repeats the processing at Steps ST19 to ST21 for each of the light-emitting elements 3R, 3G, 3B (Step ST22).

As described above, the present embodiment applies an electric current to the light-emitting elements 3 and cures the sealing member 97 using the heat of the light-emitting elements 3, thereby facilitating the lighting inspection and the repair of the light-emitting elements 3. In the method of performing the lighting inspection after mounting the light-emitting elements 3 and curing the entire sealing member 97, it is difficult to remove a defective light-emitting element 3 from the array substrate 2. By contrast, the present embodiment can cure the sealing member 97 for each non-defective light-emitting element 3 and does not cure the sealing member 97 around the defective light-emitting element 3. Consequently, the method for manufacturing the display device 1 according to the present embodiment can facilitate the lighting inspection and the repair of the light-emitting elements 3.

The manufacturing method illustrated in FIG. 9 is given by way of example only and can be appropriately modified.

As described above, the display device 1 according to the present embodiment includes the array substrate 2, the mounting electrodes 24, the columnar conductors 25, the light-emitting elements 3, the first electrodes (e.g., the anode electrodes 32) and the second electrodes (e.g., the cathode electrodes 33), and the coupling members 34. The mounting electrodes 24 are provided to the array substrate 2. The columnar conductors 25 for coupling are provided to the respective mounting electrodes 24. The light-emitting elements 3 are provided to the array substrate 2. The first electrodes and the second electrodes are provided to the surfaces of the light-emitting elements 3 facing the array substrate 2. The first electrode is coupled to one of an anode and a cathode of the light-emitting element 3, and the second electrode is coupled to the other of the anode and the cathode of the light-emitting element 3. The coupling members 34 cover the first electrodes and the second electrodes. The columnar conductor 25 is made of material harder than the coupling member 34, and the ends of the columnar conductors 25 on the light-emitting element 3 side are electrically coupled to the respective coupling members 34.

The method for manufacturing the display device 1 according to the present embodiment includes: forming the anode electrode 32 (first electrode) and the cathode electrode 33 (second electrode) having different polarities on one surface of the light-emitting element 3 and forming the coupling members 34 covering the anode electrode 32 (first electrode) and the cathode electrode 33 (second electrode) (Steps ST12 and ST13); forming the mounting electrodes 24 on the array substrate 2 and forming the columnar conductors 25 for coupling on the respective mounting electrodes 24 (Steps ST16 and ST17); and applying pressure to the light-emitting element 3 and electrically coupling the columnar conductors 25 and the coupling members 34.

According to this method, the columnar conductors 25 for coupling are provided to the array substrate 2. Therefore, the present embodiment can perform the transfer process in a simpler manner than a case where the columnar conductors 25 are formed on the light-emitting element 3. Alternatively, the present embodiment can prevent the columnar conductors 25 from being damaged if the transfer process is repeatedly performed a plurality of times compared with the case where the columnar conductors 25 are formed on the light-emitting element 3. Consequently, the display device 1 can secure the coupling stability.

Second Embodiment

Figure 12:
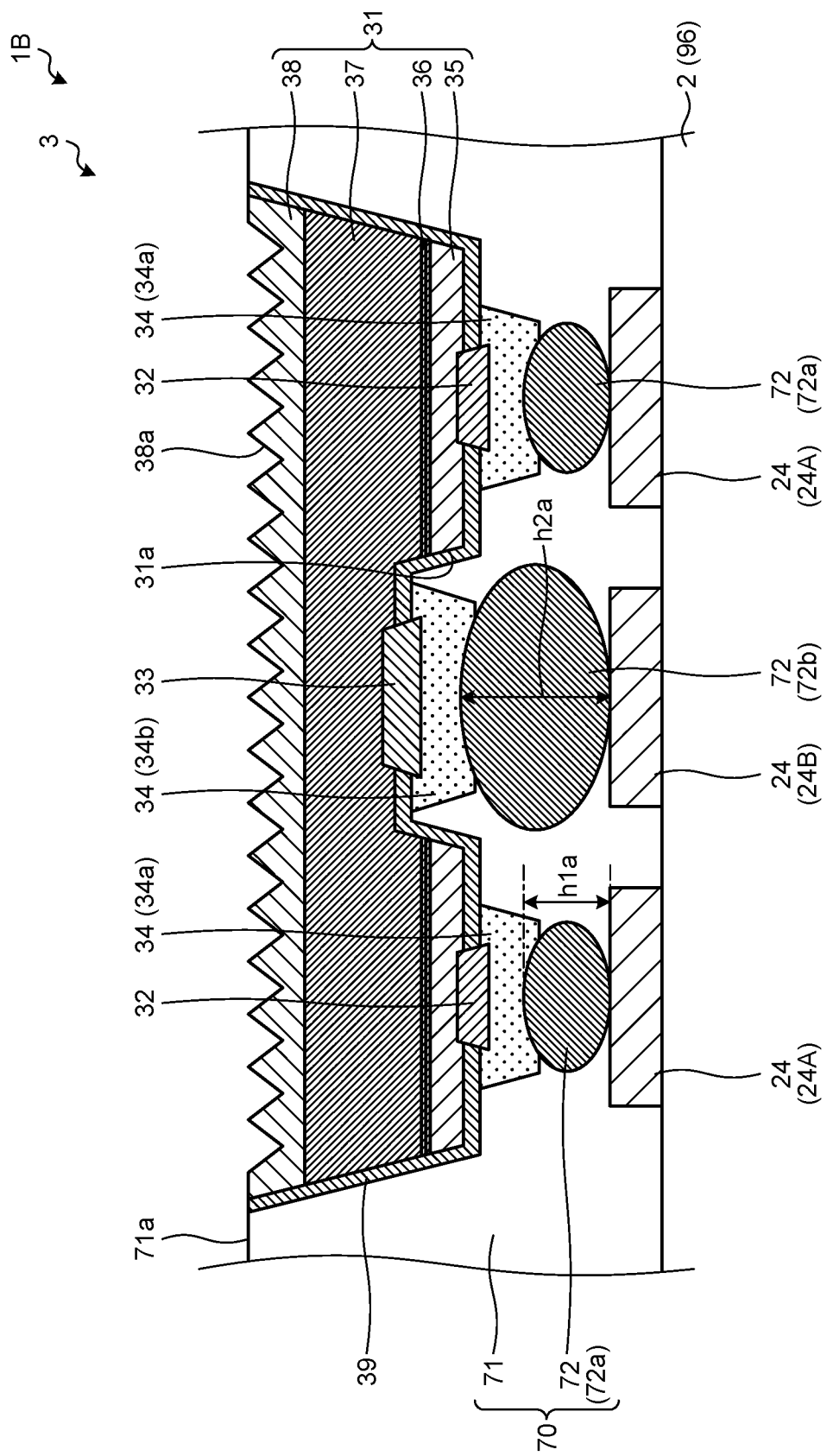
FIG. 12 is a sectional view schematically illustrating a coupling configuration between the light-emitting element and the array substrate according to a second embodiment.

FIG. 12 is a sectional view schematically illustrating a coupling configuration between the light-emitting element and the array substrate according to a second embodiment. As illustrated in FIG. 12, a display device 1B according to the second embodiment includes an anisotropic conductive film (ACF) 70 between the array substrate 2 and the light-emitting element 3 instead of the columnar conductors 25.

The anisotropic conductive film 70 includes an insulating resin material 71 and conductive particles 72 dispersed in the insulating resin material 71. The conductive particles 72 include a first conductive particle 72a and a second conductive particle 72b having different particle sizes. The particle size of the first conductive particle 72a is smaller than that of the second conductive particle 72b. The first conductive particle 72a is disposed on the first mounting electrode 24A and is coupled to the first coupling member 34a of the light-emitting element 3. As a result, the anode electrode 32 is electrically coupled to the first mounting electrode 24A via the first coupling member 34a and the first conductive particle 72a.

The second conductive particle 72b is disposed on the second mounting electrode 24B and is coupled to the second coupling member 34b of the light-emitting element 3. As a result, the cathode electrode 33 is electrically coupled to the second mounting electrode 24B via the second coupling member 34b and the second conductive particle 72b.

In other words, in the region overlapping the anode electrode 32, the first mounting electrode 24A, the first conductive particle 72a, the first coupling member 34a, the anode electrode 32, and the semiconductor layer 31 (p-type cladding layer 35) of the light-emitting element 3 are stacked in this order in the direction perpendicular to the array substrate 2. In the region overlapping the cathode electrode 33, the second mounting electrode 24B, the second conductive particle 72b, the second coupling member 34b, the cathode electrode 33, and the semiconductor layer 31 (n-type cladding layer 37) of the light-emitting element 3 are stacked in this order in the direction perpendicular to the array substrate 2.

The conductive particles 72 (the first conductive particle 72a and the second conductive particle 72b) are made of material harder than the coupling members 34 (the first coupling member 34a and the second coupling member 34b). Therefore, the part of the first coupling member 34a coupled to the first conductive particle 72a has a recess. The part of the second coupling member 34b coupled to the second conductive particle 72b has a recess. This configuration increases the contact area between the conductive particle 72 and the coupling member 34, thereby securing the coupling stability.

In the process of transferring the light-emitting element 3 to the array substrate 2 (refer to Step ST19 in FIG. 9), pressure is applied to the conductive particles 72 between the light-emitting element 3 and the array substrate 2, thereby deforming the conductive particles 72. A height h1a of the first conductive particle 72a after mounting the light-emitting element 3 is lower than a height h2a of the second conductive particle 72b. The width of the first conductive particle 72a is smaller than that of the second conductive particle 72b. In other words, the particle size of the first conductive particle 72a overlapping the anode electrode 32 is smaller than that of the second conductive particle 72b overlapping the cathode electrode 33. By providing the first conductive particle 72a and the second conductive particle 72b of the anisotropic conductive film 70 on the first mounting electrode 24A and the second mounting electrode 24B, respectively, the present embodiment can secure the coupling stability between the anode electrode 32 and the cathode electrode 33 of the light-emitting element 3 and the first mounting electrode 24A and the second mounting electrode 24B of the array substrate 2, respectively, if the anode electrode 32 and the cathode electrode 33 of the light-emitting element 3 are formed at different height positions.

The insulating resin material 71 is made of insulating material and is provided around the conductive particles 72 between the array substrate 2 and the light-emitting elements 3. The insulating resin material 71 also functions as a sealing member. An upper surface 71a of the insulating resin material 71 forms the same plane with the upper surfaces of the light-emitting elements 3. The configuration is not limited thereto, and the upper surface 71a of the insulating resin material 71 may be misaligned from the upper surfaces of the light-emitting elements 3. To facilitate reader's understanding, one conductive particle 72 is disposed on one mounting electrode 24 in FIG. 12. The configuration is not limited to there, and the conductive particles 72 may be aggregated on one mounting electrode 24.

Third Modification of the Second Embodiment

Figure 13:
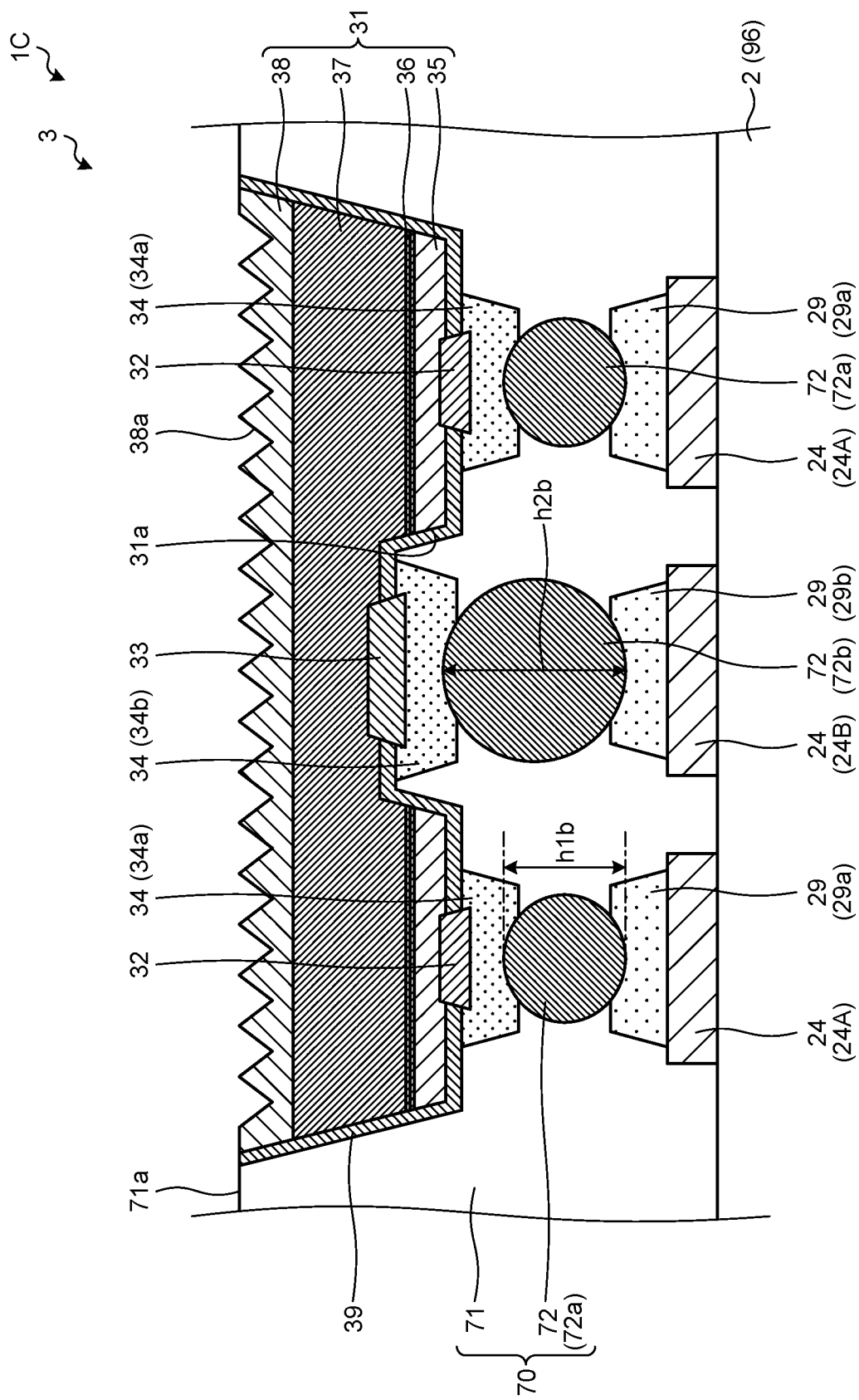
FIG. 13 is a sectional view schematically illustrating a coupling configuration between the light-emitting element and the array substrate according to a third modification of the second embodiment.

FIG. 13 is a sectional view schematically illustrating a coupling configuration between the light-emitting element and the array substrate according to a third modification of the second embodiment. As illustrated in FIG. 13, a display device 1C according to the third modification of the second embodiment includes mounting electrode coupling members 29 on the respective mounting electrodes 24. The mounting electrode coupling member 29 is made of material having hardness lower than that of the conductive particle 72. More preferably, the columnar conductor coupling member 28 is made of the same material as that of the coupling member 34 of the light-emitting element 3. The mounting electrode coupling member 29 is made of metal material containing at least one of tin (Sn) and indium (In), for example.

More specifically, a first mounting electrode coupling member 29a is provided on the first mounting electrode 24A. The first conductive particle 72a is provided between the first mounting electrode coupling member 29a on the array substrate 2 and the first coupling member 34a on the light-emitting element 3. A second mounting electrode coupling member 29b is provided on the second mounting electrode 24B. The second conductive particle 72b is provided between the second mounting electrode coupling member 29b on the array substrate 2 and the second coupling member 34b on the light-emitting element 3.

In the third modification, the mounting electrode coupling member 29 and the coupling member 34 made of the same material are in contact with the conductive particle 72 on and under the conductive particle 72. This configuration reduces the pressure applied to the conductive particle 72 in mounting the light-emitting element 3. Therefore, a height h1b of the first conductive particle 72a and a height h2b of the second conductive particle 72b after mounting the light-emitting element 3 according to the third modification remain higher than the height h1a of the first conductive particle 72a and the height h2a of the second conductive particle 72b according to the second embodiment. As a result, the third modification can suppress unintended deformation of the conductive particles 72, thereby suppressing a short circuit between adjacent mounting electrodes 24. Consequently, the third modification can improve the coupling stability between the light-emitting element 3 and the array substrate 2.

FIG. 14 is a view for explaining a process of forming the anisotropic conductive film in the method for manufacturing the display device according to the second embodiment. The method for manufacturing the display device 1B according to the second embodiment and the display device 1C according to the third modification can employ the same flowchart as that illustrated in FIG. 9. The manufacturing method, however, includes the process illustrated in FIG. 14 (Step ST17A) instead of the process of forming the columnar conductors 25 in FIG. 9 (Step ST17). The process of forming the sealing member 97 in FIG. 9 (Step ST18) is omitted.

As illustrated in FIG. 14, the manufacturing method according to the second embodiment includes forming the anisotropic conductive film 70 on the array substrate 2 provided with the mounting electrodes 24 (Step ST17A). When forming the anisotropic conductive film 70, the first conductive particles 72a having a smaller particle size are disposed on the respective first mounting electrodes 24A, and the second conductive particle 72b having a larger particle size is disposed on the second mounting electrode 24B. The insulating resin material 71 is provided on the array substrate 2 to cover the first conductive particles 72a and the second conductive particle 72b.

After Step ST17A, the manufacturing apparatus performs the processes subsequent to Step ST19 illustrated in FIG. 9. As a result, the light-emitting element 3 is mounted on the array substrate 2 with the first conductive particles 72a and the second conductive particle 72b of the anisotropic conductive film 70 interposed therebetween. The lighting inspection and the repair at Steps ST20 and ST21 in FIG. 9 can also be performed on the display devices 1B and 1C according to the second embodiment.

While exemplary embodiments according to the present disclosure have been described, the embodiments are not intended to limit the disclosure. The contents disclosed in the embodiments are given by way of example only, and various modifications may be made without departing from the spirit of the present disclosure. Appropriate modifications made without departing from the spirit of the present disclosure naturally fall within the technical scope of the disclosure. At least one of various omissions, substitutions, and modifications of the components may be made without departing from the gist of the embodiments above and the modification thereof.

What is claimed is:

1. A display device comprising:
    an array substrate;
    a plurality of mounting electrodes provided to the array substrate;
    a columnar conductor for coupling provided to each of the mounting electrodes;
    a plurality of light-emitting elements provided to the array substrate;
    a first electrode and a second electrode provided to a surface of each of the light-emitting elements facing the array substrate, the first electrode being coupled to one of an anode and a cathode of the light-emitting element, the second electrode being coupled to the other of the anode and the cathode of the light-emitting element;
    a coupling member covering each of the first electrode and the second electrode; and
    a plurality of the first electrodes,
    wherein
    the columnar conductor is made of material harder than the coupling member, and an end of the columnar conductor on the light-emitting element side is electrically coupled to the coupling member,
    the second electrode is disposed in a recess formed on a surface of the light-emitting element facing the array substrate,
    the second electrode is disposed between the first electrodes in planar view seen from the surface of the light-emitting element facing the array substrate,
    a plurality of the columnar conductors include a first columnar conductor electrically coupled to the first electrode and a second columnar conductor electrically coupled to the second electrode, and
    the height of the first columnar conductor is lower than the height of the second columnar conductor.

2. The display device according to claim 1, wherein the mounting electrode, the columnar conductor, the coupling member, and the first electrode or the second electrode are stacked in order in a direction perpendicular to the array substrate.

3. The display device according to claim 1, further comprising:
    a sealing member made of insulating material and provided between the array substrate and the light-emitting elements, wherein
    the sealing member covers a periphery of an upper surface of the light-emitting elements.

4. The display device according to claim 1, wherein
    an end of the columnar conductor on the light-emitting element side is directly coupled to the coupling member, and
    the recess is formed at a part of the coupling member coupled to the columnar conductor.

5. The display device according to claim 1, wherein the coupling member contains at least one of tin (Sn) and indium (In).

6. A display device comprising:
    an array substrate;
    a plurality of mounting electrodes provided to the array substrate;
    a columnar conductor for coupling provided to each of the mounting electrodes;
    a plurality of light-emitting elements provided to the array substrate;
    a first electrode and a second electrode provided to a surface of each of the light-emitting elements facing the array substrate, the first electrode being coupled to one of an anode and a cathode of the light-emitting element, the second electrode being coupled to the other of the anode and the cathode of the light-emitting element; and
    a coupling member covering each of the first electrode and the second electrode,
    wherein
    the columnar conductor is made of material harder than the coupling member, and an end of the columnar conductor on the light-emitting element side is electrically coupled to the coupling member,
    a columnar conductor coupling member made of material having hardness lower than the hardness of the columnar conductor is provided at an end on the light-emitting element side of the columnar conductor, and
    the columnar conductor coupling member is in contact with the coupling member provided to the light-emitting element.

7. A method for manufacturing a display device, the method comprising:
    forming a first electrode and a second electrode having different polarities on one surface of a light-emitting element and forming a coupling member covering each of the first electrode and the second electrode;
    forming a plurality of mounting electrodes on an array substrate and forming a columnar conductor for coupling on each of the mounting electrodes;
    applying pressure to the light-emitting element and electrically coupling the columnar conductor and the coupling member;
    forming a sealing member on the array substrate to cover the columnar conductor for coupling after the forming the columnar conductor for coupling and before coupling the light-emitting element; and applying an electric current to the light-emitting element and curing the sealing member around the light-emitting element after the coupling the light-emitting element.

* * * * *